US012811559B2

(12) United States Patent
Inoue et al.

(10) Patent No.: US 12,811,559 B2
(45) Date of Patent: Nov. 24, 2026

(54) PIEZOELECTRIC BULK WAVE DEVICE WITH A SUPPORT INCLUDING A HOLLOW PORTION OVERLAPPING A PORTION OF AN IDT ELECTRODE AND MANUFACTURING METHOD THEREOF

(71) Applicant: Murata Manufacturing Co., Ltd., Nagaokakyo (JP)

(72) Inventors: Kazunori Inoue, Nagaokakyo (JP); Katsumi Suzuki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 521 days.

(21) Appl. No.: 18/515,873

(22) Filed: Nov. 21, 2023

(65) Prior Publication Data

US 2024/0088864 A1 Mar. 14, 2024

Related U.S. Application Data

(63) Continuation of application No. PCT/JP2022/020471, filed on May 17, 2022.

(Continued)

(51) Int. Cl.

*H03H 9/02* (2006.01)
*H03H 3/04* (2006.01)

(Continued)

(52) U.S. Cl.

CPC .......... *H03H 9/02228* (2013.01); *H03H 3/04* (2013.01); *H03H 9/02031* (2013.01);

(Continued)

(58) Field of Classification Search

CPC ............... H03H 3/04; H03H 2003/021; H03H 2003/0442; H03H 9/02228;

(Continued)

(56) References Cited

U.S. PATENT DOCUMENTS 10,491,192 B1 11/2019 Plesski et al.
2007/0069837 A1* 3/2007 Nishimura ......... H03H 9/14588 333/195

(Continued)

FOREIGN PATENT DOCUMENTS

JP 5339582 B2 11/2013
WO 2010082571 A1 7/2010

(Continued)

OTHER PUBLICATIONS

International Search Report in PCT/JP2022/020471, mailed Jul. 19, 2022, 3 pages.

(Continued)

*Primary Examiner* — Emily P Pham
(74) *Attorney, Agent, or Firm* — Keating & Bennett, LLP

(57) ABSTRACT

A piezoelectric bulk wave device includes a support including a support substrate, a piezoelectric layer on the support and including first and second principal surfaces, an IDT electrode on the first principal surface and including a pair of comb-shaped electrodes each including electrode fingers and a busbar connecting the electrode fingers, and a frequency adjustment film on the second principal surface and overlapping at least a portion of the IDT electrode. The support includes a hollow portion overlapping at least a portion of the IDT electrode. d/p is less than or equal to about 0.5. Via holes are provided to the piezoelectric layer and the frequency adjustment film. Wiring electrodes are provided in the via holes and on the frequency adjustment film and electrically connected to the busbars of the comb-shaped electrodes.

20 Claims, 14 Drawing Sheets

Related U.S. Application Data

(60) Provisional application No. 63/194,287, filed on May 28, 2021.

(51) Int. Cl.
*H03H 9/17* (2006.01)
*H03H 3/02* (2006.01)

(52) U.S. Cl.
CPC ............ *H03H 9/173* (2013.01); *H03H 9/176* (2013.01); *H03H 2003/021* (2013.01); *H03H 2003/0442* (2013.01)

(58) Field of Classification Search
CPC .... H03H 9/02031; H03H 9/173; H03H 9/176; H03H 9/02015; H03H 9/02062; H03H 9/02157; H03H 9/174
See application file for complete search history.

(56) References Cited

U.S. PATENT DOCUMENTS

| | | | | |
|---|---|---|---|---|
| 2010/0188173 | A1 | 7/2010 | Matsuda et al. | |
| 2011/0266918 | A1 | 11/2011 | Iwamoto et al. | |
| 2014/0152145 | A1* | 6/2014 | Kando | H03H 9/02574 29/25.35 |
| 2017/0264266 | A1 | 9/2017 | Kishimoto | |
| 2019/0068155 | A1 | 2/2019 | Kimura et al. | |
| 2020/0321939 | A1 | 10/2020 | Turner et al. | |
| 2022/0216854 | A1 | 7/2022 | Yamane et al. | |

FOREIGN PATENT DOCUMENTS

| | | | |
|---|---|---|---|
| WO | 2016103925 | A1 | 6/2016 |
| WO | 2017212774 | A1 | 12/2017 |
| WO | 2021060510 | A1 | 4/2021 |

OTHER PUBLICATIONS

Written Opinion in PCT/JP2022/020471, mailed Jul. 19, 2022, 3 pages.

* cited by examiner

PIEZOELECTRIC BULK WAVE DEVICE WITH A SUPPORT INCLUDING A HOLLOW PORTION OVERLAPPING A PORTION OF AN IDT ELECTRODE AND MANUFACTURING METHOD THEREOF

CROSS REFERENCE TO RELATED APPLICATIONS

This application claims the benefit of priority to Provisional Application No. 63/194,287 filed May 28, 2021 and is a Continuation Application of PCT Application No. PCT/JP2022/020471 filed on May 17, 2022. The entire contents of each application are hereby incorporated herein by reference.

BACKGROUND OF THE INVENTION

1. Field of the Invention

The present invention relates to a piezoelectric bulk wave device and a manufacturing method thereof.

2. Description of the Related Art

Acoustic wave devices such as piezoelectric bulk wave devices have heretofore been widely used in filters of cellular phones and the like. A piezoelectric bulk wave device using a bulk wave in a thickness-shear mode as described in U.S. Pat. No. 10,491,192 has been proposed in recent years. In this piezoelectric bulk wave device, a piezoelectric layer is provided on a support body. A pair of electrodes are provided on the piezoelectric layer. The pair of electrodes are opposed to each other on the piezoelectric layer and are coupled to electric potentials that are different from each other. A bulk wave in the thickness-shear mode is excited by applying an alternating-current voltage between the electrodes.

Japanese Patent No. 5339582 discloses an example of an acoustic wave device. In this acoustic wave device, comb-shaped electrodes are provided on a piezoelectric substrate. A frequency adjustment film is provided on the piezoelectric substrate so as to cover the comb-shaped electrodes. Frequency characteristics of the acoustic wave device are adjusted by adjusting a thickness of the frequency adjustment film.

A high-frequency filter is required to adjust a frequency with high accuracy. For example, an acoustic wave device such as a piezoelectric bulk wave device is provided with a frequency adjustment film so as to cover electrodes for exciting an acoustic wave. The frequency is adjusted by adjusting a thickness of the frequency adjustment film.

However, the frequency adjustment film in the acoustic wave device described in Japanese Patent No. 5339582 has an uneven shape. For this reason, when adjusting the thickness of the frequency adjustment film, the thickness varies in a direction other than a direction in which the frequency adjustment film and the piezoelectric substrate are laminated as well. Accordingly, it has been difficult to perform adjustment to a desired frequency with high accuracy.

SUMMARY OF THE INVENTION

Preferred embodiments of the present invention provide piezoelectric bulk wave devices and manufacturing methods thereof, which are each able to adjust a frequency with high accuracy.

A piezoelectric bulk wave device according to a preferred embodiment of the present invention includes a support including a support substrate, a piezoelectric layer on the support and including a first principal surface on a support side and a second principal surface opposed to the first principal surface, an IDT electrode on the first principal surface of the piezoelectric layer and including a pair of comb-shaped electrodes each including a plurality of electrode fingers and a busbar connecting one ends of the plurality of electrode fingers, and a frequency adjustment film on the second principal surface of the piezoelectric layer and overlapping at least a portion of the IDT electrode in plan view. The support includes a hollow portion overlapping at least a portion of the IDT electrode in plan view. In a case where a thickness of the piezoelectric layer is defined as d and a center-to-center distance between electrode fingers being adjacent to each other is defined as p, d/p is less than or equal to about 0.5. A plurality of via holes are provided to the piezoelectric layer and the frequency adjustment film. The piezoelectric bulk wave device further includes a plurality of wiring electrodes in the respective via holes of the piezoelectric layer and the frequency adjustment film and on the frequency adjustment film and electrically connected to the busbars of the comb-shaped electrodes.

A method of manufacturing a piezoelectric bulk wave device according to a preferred embodiment of the present invention includes providing an IDT electrode on a third principal surface of a piezoelectric substrate including the third principal surface and a fourth principal surface opposed to each other, the IDT electrode including a pair of comb-shaped electrodes each including a busbar connected to one ends of a plurality of electrode fingers, providing a sacrificial layer to at least one of the third principal surface of the piezoelectric substrate and a support substrate, forming a multilayer body by joining the support substrate to a third principal surface side of the piezoelectric substrate, the multilayer body including the support substrate and the piezoelectric substrate in which the sacrificial layer covers at least the pluralities of electrode fingers of the IDT electrode, forming a piezoelectric layer including a first principal surface corresponding to the third principal surface and a second principal surface opposed to the first principal surface by grinding a fourth principal surface side of the piezoelectric substrate so as to reduce a thickness of the piezoelectric substrate, providing a frequency adjustment film to the second principal surface of the piezoelectric layer, providing a plurality of via holes to the piezoelectric layer and the frequency adjustment film, providing a plurality of wiring electrodes in the respective via holes and on the frequency adjustment film so as to be electrically connected to the busbars, providing a through hole in the piezoelectric layer and the frequency adjustment film so as to extend to the sacrificial layer, forming a hollow portion in a piezoelectric board including the support substrate and the piezoelectric layer by removing the sacrificial layer using the through hole, and adjusting a frequency by grinding the frequency adjustment film.

According to preferred embodiments of the present invention, it is possible to provide piezoelectric bulk wave devices and manufacturing methods thereof, which are each able to adjust a frequency with high accuracy.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by explaining preferred embodiments of the present invention with reference to the drawings.

Respective preferred embodiments described in the present specification are merely exemplary, and partial replacement or combination of configurations across different preferred embodiments are possible.

Figure 1:
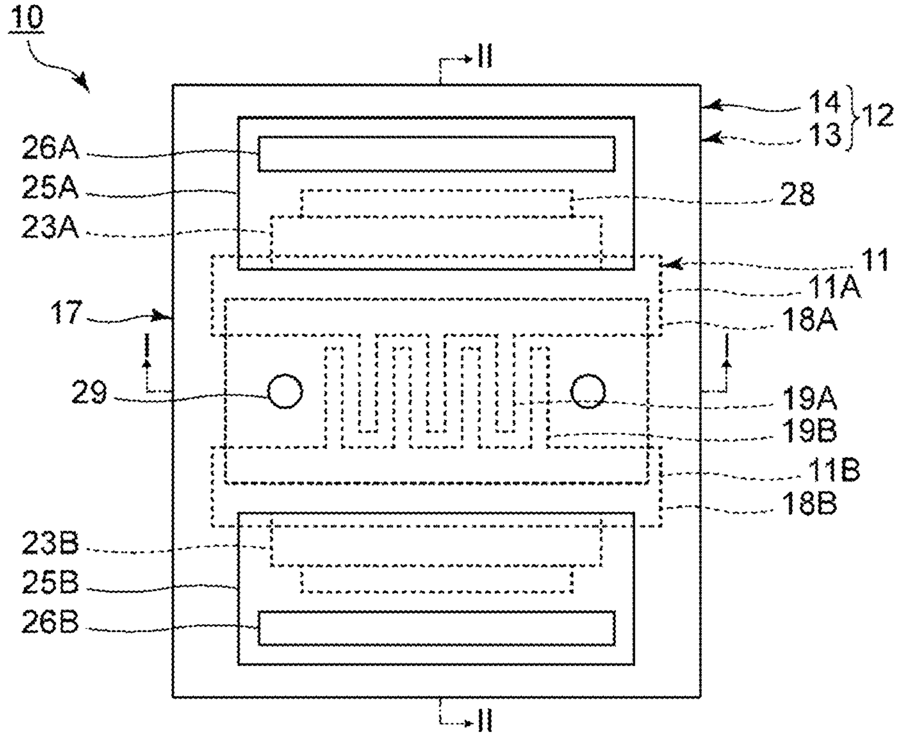
FIG. 1 is a schematic plan view of a piezoelectric bulk wave device according to a first preferred embodiment of the present invention.
Figure 2:
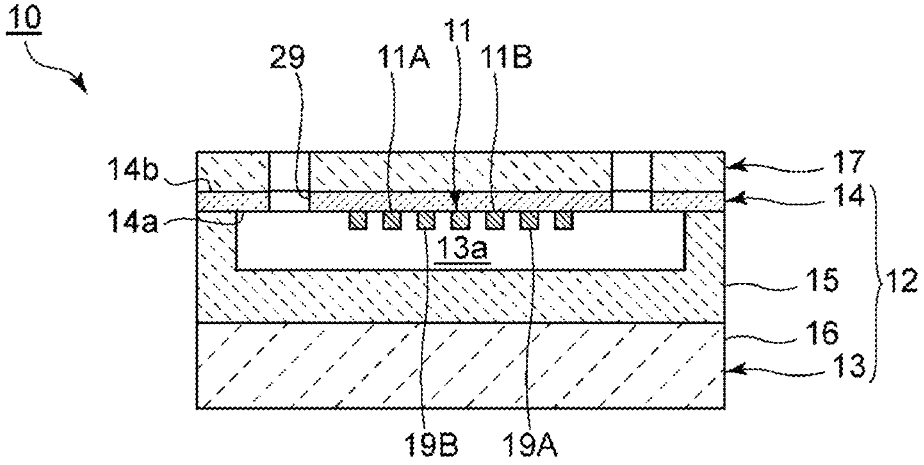
FIG. 2 is a schematic sectional view taken along I-I line in FIG. 1.
Figure 3:
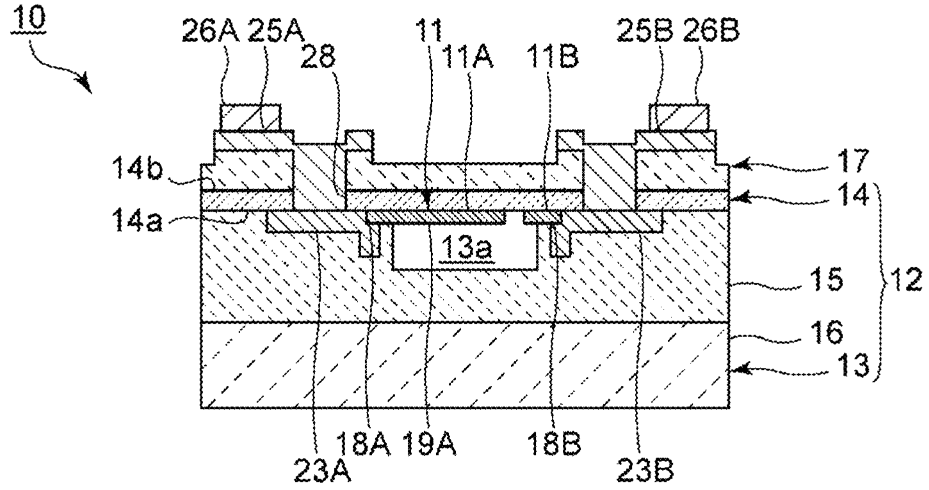
FIG. 3 is a schematic sectional view taken along II-II line in FIG. 1.

FIG. 1 is a schematic plan view of a piezoelectric bulk wave device according to a first preferred embodiment of the present invention. FIG. 2 is a schematic sectional view taken along I-I line in FIG. 1. FIG. 3 is a schematic sectional view taken along II-II line in FIG. 1.

As shown in FIG. 1, a piezoelectric bulk wave device 10 includes a piezoelectric board 12 and an IDT electrode 11. As shown in FIG. 2, the piezoelectric board 12 includes a support 13 and a piezoelectric layer 14. In the present preferred embodiment, the support 13 includes a support substrate 16 and an insulating layer 15. The insulating layer 15 is provided on the support substrate 16. The piezoelectric layer 14 is provided on the insulating layer 15. However, the support 13 may include only the support substrate 16.

A semiconductor such as silicon or a ceramic such as aluminum oxide can be used as a material of the support substrate 16, for example. An appropriate dielectric such as silicon oxide or tantalum pentoxide can be used as a material of the insulating layer 15, for example. A lithium tantalate layer such as a $LiTaO_3$ layer or a lithium niobate layer such as a $LiNbO_3$ layer can be used as a material of the piezoelectric layer 14, for example.

The support 13 includes a hollow portion 13*a*. To be more precise, the insulating layer 15 includes a recess. The piezoelectric layer 14 is provided on the insulating layer 15 so as to cover the recess. The hollow portion 13*a* is thus provided. Here, the hollow portion 13*a* may be provided across the insulating layer 15 and the support substrate 16 or provided in the support substrate 16 only.

The piezoelectric layer 14 includes a first principal surface 14*a* and a second principal surface 14*b*. The first principal surface 14*a* and the second principal surface 14*b* are opposed to each other. Of the first principal surface 14*a* and the second principal surface 14*b*, the first principal surface 14*a* is located on the support 13 side. The IDT electrode 11 is provided on the first principal surface 14*a*. In plan view, at least a portion of the IDT electrode 11 overlaps the hollow portion 13*a* of the support 13. In the present specification, plan view means a view from a direction corresponding to an upper portion in FIG. 2 or FIG. 3. Of the support substrate 16 side and the piezoelectric layer 14 side in FIGS. 2 and 3, the piezoelectric layer 14 side is the upper portion.

As shown in FIG. 1, the IDT electrode 11 includes a first comb-shaped electrode 11A and a second comb-shaped electrode 11B. The first comb-shaped electrode 11A includes a first busbar 18A and first electrode fingers 19A. In the first comb-shaped electrode 11A, one ends of the first electrode fingers 19A are connected to the first busbar 18A. On the other hand, the second comb-shaped electrode 11B includes a second busbar 18B and second electrode fingers 19B. In the second comb-shaped electrode 11B, one ends of the second electrode fingers 19B are connected to the second busbar 18B. The first busbar 18A and the second busbar 18B are opposed to each other. The first electrode fingers 19A and the second electrode fingers 19B are interdigitated with one another. The IDT electrode 11 may include a single layer of a metal film or a laminated metal film. The first electrode fingers 19A and the second electrode fingers 19B may be hereinafter simply referred to as the electrode fingers as appropriate.

In a case where a thickness of the piezoelectric layer is defined as d and a center-to-center distance between electrode fingers being adjacent to each other is defined as p, d/p is, for example, less than or equal to about 0.5 in the present preferred embodiment. The piezoelectric bulk wave device 10 is configured to be capable of using a bulk wave in a thickness-shear mode such as a thickness-shear primary mode, for example.

As shown in FIG. 2, a frequency adjustment film 17 is provided on the second principal surface 14*b* of the piezoelectric layer 14. To be more precise, the frequency adjustment film 17 is provided so as to overlap at least a portion of the IDT electrode 11 in plan view.

Silicon oxide, silicon nitride, or the like can be used as a material of the frequency adjustment film 17, for example. A frequency of a main mode used by the piezoelectric bulk wave device 10 can be adjusted by adjusting a thickness of the frequency adjustment film 17. In adjusting the thickness of the frequency adjustment film 17, the frequency adjustment film 17 may be trimmed by, for example, milling, dry etching, or the like.

As shown in FIG. 3, the first principal surface 14*a* of the piezoelectric layer 14 includes a first connection electrode 23A and a second connection electrode 23B. The first connection electrode 23A is connected to the first busbar 18A of the first comb-shaped electrode 11A. The second connection electrode 23B is connected to the second busbar 18B of the second comb-shaped electrode 11B.

The piezoelectric layer 14 and the frequency adjustment film 17 include via holes 28. Each via hole 28 is continuously provided to the piezoelectric layer 14 and to the frequency adjustment film 17. One via hole 28 of the via holes 28 extends to the first connection electrode 23A. A first wiring electrode 25A is continuously provided in this via hole 28 and on the frequency adjustment film 17. The first wiring electrode 25A is connected to the first connection electrode 23A. Another one of the via holes 28 extends to the second connection electrode 23B. A second wiring electrode 25B is continuously provided in this via hole 28 and on the frequency adjustment film 17. The second wiring electrode 25B is connected to the second connection electrode 23B.

A portion of the first wiring electrode 25A provided on the frequency adjustment film 17 is connected to a first terminal electrode 26A. To be more precise, the first terminal electrode 26A is provided on the first wiring electrode 25A. A portion of the second wiring electrode 25B provided on the frequency adjustment film 17 is connected to a second terminal electrode 26B. To be more precise, the second terminal electrode 26B is provided on the second wiring electrode 25B. The piezoelectric bulk wave device 10 is electrically connected to another element and the like via the first terminal electrode 26A and the second terminal electrode 26B.

As shown in FIG. 2, the piezoelectric layer 14 and the frequency adjustment film 17 include through holes 29. Each through hole 29 is continuously provided to the piezoelectric layer 14 and the frequency adjustment film 17. The through holes 29 are used to remove a sacrificial layer during manufacturing the piezoelectric bulk wave device 10.

The present preferred embodiment is characterized in that the piezoelectric bulk wave device 10 has the following configurations: 1) that the IDT electrode 11 is provided on the first principal surface 14*a* on the support 13 side of the piezoelectric layer 14 and the frequency adjustment film 17 is provided on the second principal surface 14*b*, 2) that the via holes 28 are provided in the piezoelectric layer 14 and the frequency adjustment film 17 as shown in FIG. 3 and the first wiring electrode 25A provided in the via hole 28 and on the frequency adjustment film 17 is electrically connected to the first busbar 18A, and 3) that the second wiring electrode 25B provided in the via hole 28 and the frequency adjustment film 17 is electrically connected to the second busbar 18B. Accordingly, it is possible to adjust the frequency with high accuracy. Details thereof will be described below together with an example of a method of manufacturing the piezoelectric bulk wave device 10 of the present preferred embodiment. In the following, a direction in which adjacent electrode fingers are opposed to each other will be referred to as an electrode finger opposing direction while a direction of extension of the electrode fingers will be referred to as an electrode finger extending direction.

Figure 4A:
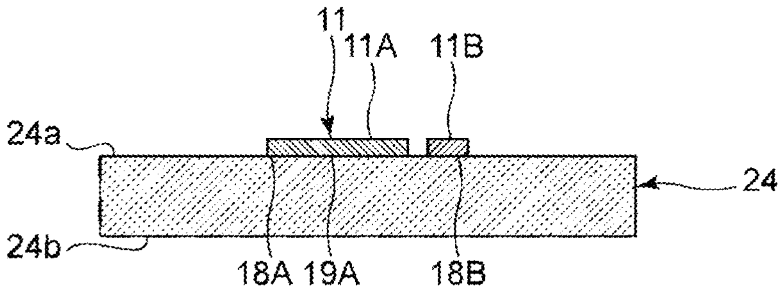
FIGS. 4A and 4B are schematic sectional views taken along an electrode finger extending direction for explaining an IDT electrode forming process and a connection electrode forming process in an example of a method of manufacturing a piezoelectric bulk wave device according to the first preferred embodiment of the present invention.
Figure 4B:
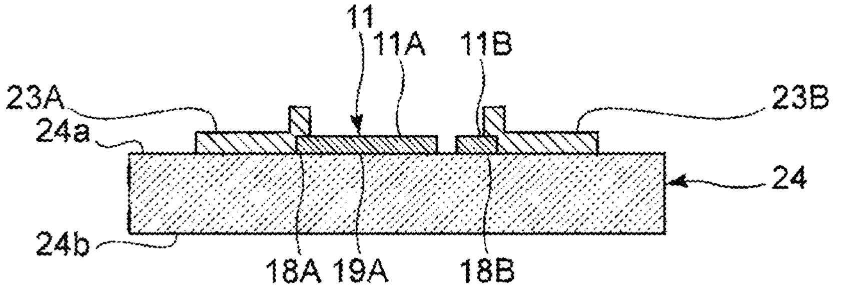
Figure 5A:
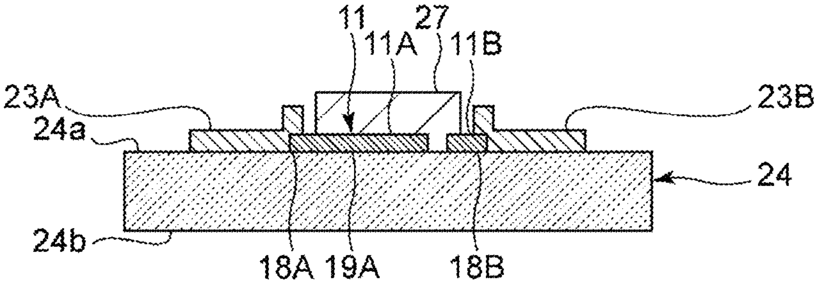
FIGS. 5A to 5C are schematic sectional views taken along the electrode finger extending direction for explaining a sacrificial layer forming process, a first insulating layer forming process, and a first insulating layer planarizing process in an example of a method of manufacturing a piezoelectric bulk wave device according to the first preferred embodiment of the present invention.
Figure 5B:
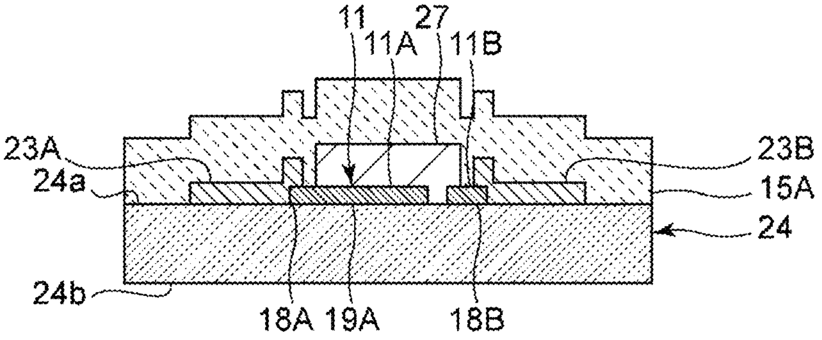
Figure 5C:
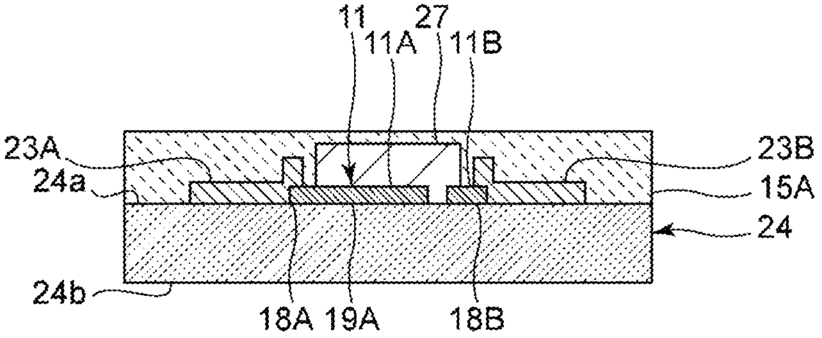

FIGS. 4A and 4B are schematic sectional views taken along the electrode finger extending direction for explaining an IDT electrode forming process and a connection electrode forming process in an example of a method of manufacturing a piezoelectric bulk wave device according to the first preferred embodiment. FIGS. 5A to 5C are schematic sectional views taken along the electrode finger extending direction for explaining a sacrificial layer forming process, a first insulating layer forming process, and a first insulating layer planarizing process in the example of the method of manufacturing a piezoelectric bulk wave device according to the first preferred embodiment.

Figure 7A:
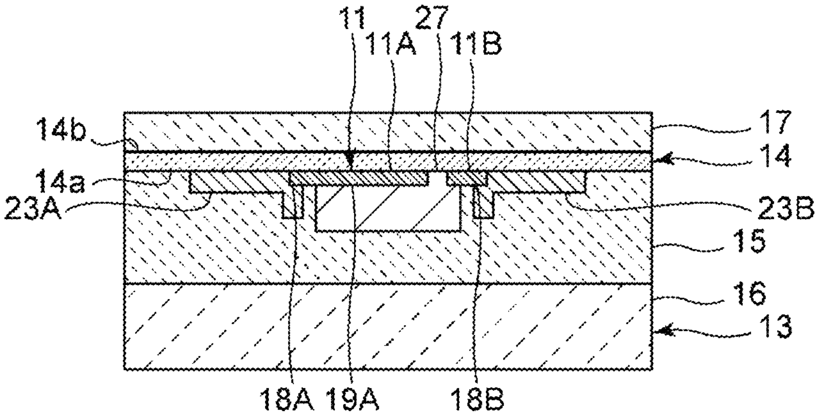
FIGS. 7A to 7C are schematic sectional views taken along the electrode finger extending direction for explaining a frequency adjustment film grinding process, a via hole forming process, a wiring electrode forming process, and a terminal electrode forming process in an example of a method of manufacturing a piezoelectric bulk wave device according to the first preferred embodiment of the present invention.
Figure 7B:
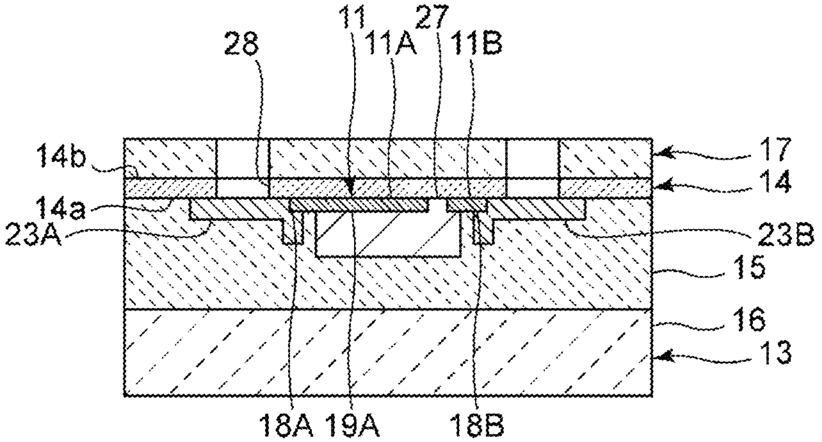
Figure 7C:
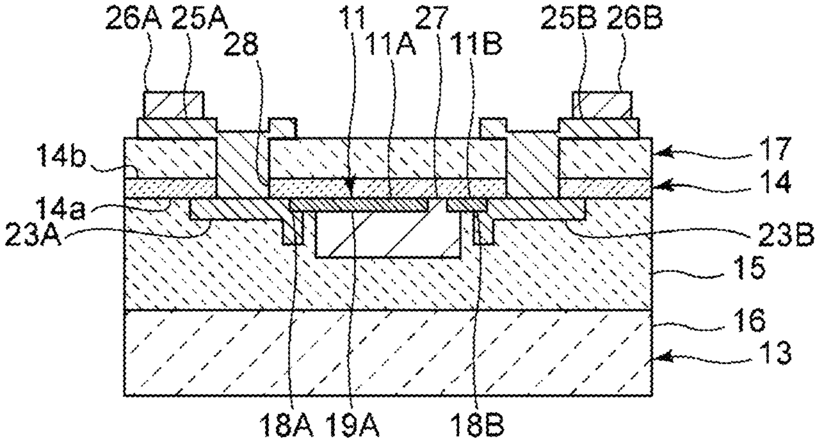
Figure 8A:
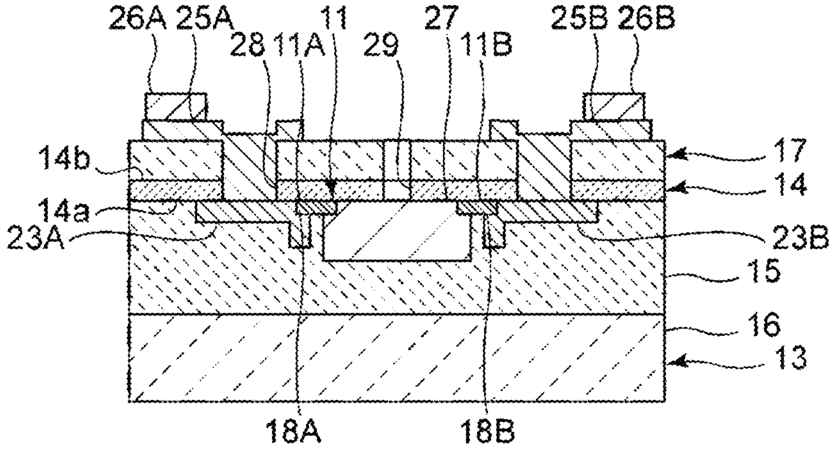
FIGS. 8A and 8B are schematic sectional views showing a—section taken along the electrode finger extending direction without passing through electrode fingers for explaining a through hole forming process and a sacrificial layer removing process in an example of a method of manufacturing a piezoelectric bulk wave device according to the first preferred embodiment of the present invention.
Figure 8B:
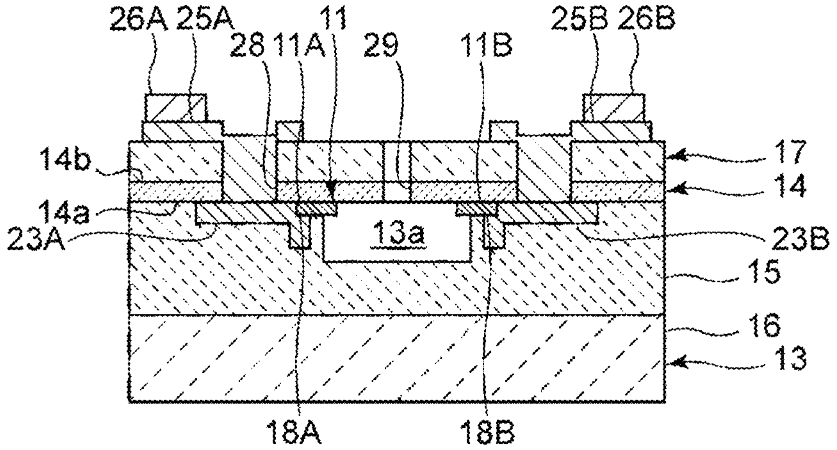

FIGS. 6A to 6D are schematic sectional views taken along the electrode finger extending direction for explaining a second insulating layer forming process, a piezoelectric substrate joining process, a piezoelectric layer grinding process, and a frequency adjustment film forming process in the example of the method of manufacturing a piezoelectric bulk wave device according to the first preferred embodiment. FIGS. 7A to 7C are schematic sectional views taken along the electrode finger extending direction for explaining a frequency adjustment film grinding process, a via hole forming process, a wiring electrode forming process, and a terminal electrode forming process in the example of the method of manufacturing a piezoelectric bulk wave device according to the first preferred embodiment. FIGS. 8A and 8B are schematic sectional views showing a section taken along the electrode finger extending direction without passing through electrode fingers for explaining a through hole forming process and a sacrificial layer removing process in the example of the method of manufacturing a piezoelectric bulk wave device according to the first preferred embodiment.

A piezoelectric substrate 24 is prepared as shown in FIG. 4A. Here, the piezoelectric substrate 24 is included in a piezoelectric layer. The piezoelectric substrate 24 includes a third principal surface 24*a* and a fourth principal surface 24*b*. The third principal surface 24*a* and the fourth principal surface 24*b* are opposed to each other. The IDT electrode 11 is provided on the third principal surface 24*a* of the piezoelectric substrate 24. The IDT electrode 11 can be formed, for example, in accordance with a lift-off method using a sputtering method, a vacuum deposition method, or the like.

Next, the first connection electrode 23A and the second connection electrode 23B are provided on the third principal surface 24*a* of the piezoelectric substrate 24 as shown in FIG. 4B. To be more precise, the first connection electrode 23A is provided so as to cover a portion of the first busbar 18A. Thus, the first connection electrode 23A is connected to the first busbar 18A. Similarly, the second connection electrode 23B is provided so as to cover a portion of the second busbar 18B. Thus, the second connection electrode 23B is connected to the second busbar 18B. The first connection electrode 23A and the second connection electrode 23B are formed, for example, in accordance with the lift-off method using the sputtering method, the vacuum deposition method, or the like.

Next, a sacrificial layer 27 is provided on the third principal surface 24*a* of the piezoelectric substrate 24 as shown in FIG. 5B. The sacrificial layer 27 is provided so as to cover the electrode fingers and at least a portion of the first busbar 18A and the second busbar 18B of the IDT electrode 11. On the other hand, the sacrificial layer 27 does not cover the first connection electrode 23A and the second connection electrode 23B. An inorganic oxide film such as ZnO, MgO, and $SiO_2$, a metal film such as Cu, a resin, or the like can be used as a material of the sacrificial layer 27, for example.

Next, a first insulating layer 15A is provided on the third principal surface 24*a* of the piezoelectric substrate 24 as shown in FIG. 5B. To be more precise, the first insulating layer 15A is provided so as to cover the IDT electrode 11 and the sacrificial layer 27. The first insulating layer 15A can be formed in accordance with, for example, the sputtering method, the vacuum deposition method, or the like. Next, the first insulating layer 15A is planarized as shown in FIG. 5C. Grinding, a CMP (chemical mechanical polishing) method, or the like may be used in planarizing the first insulating layer 15A, for example.

Figure 6A:
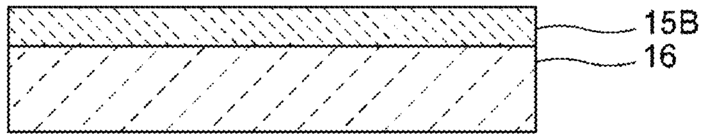
FIGS. 6A to 6D are schematic sectional views taken along the electrode finger extending direction for explaining a second insulating layer forming process, a piezoelectric substrate joining process, a piezoelectric layer grinding process, and a frequency adjustment film forming process in an example of a method of manufacturing a piezoelectric bulk wave device according to the first preferred embodiment of the present invention.
Figure 6B:
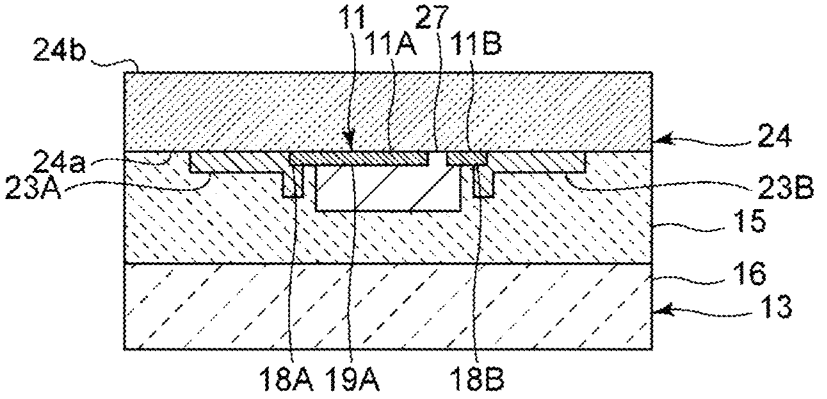

In the meantime, a second insulating layer 15B is provided on one principal surface side of the support substrate 16 as shown in FIG. 6A. Next, the first insulating layer 15A shown in FIG. 5C is joined to the second insulating layer 15B shown in FIG. 6A. Thus, the insulating layer 15 is formed as shown in FIG. 6B, and a multilayer body is formed by joining the support substrate 16 and the piezoelectric substrate 24 thereto. The multilayer body includes the support substrate 16 and the piezoelectric substrate 24. Moreover, in the multilayer body, the sacrificial layer 27 covers at least the electrode fingers of the IDT electrode 11.

Figure 6C:
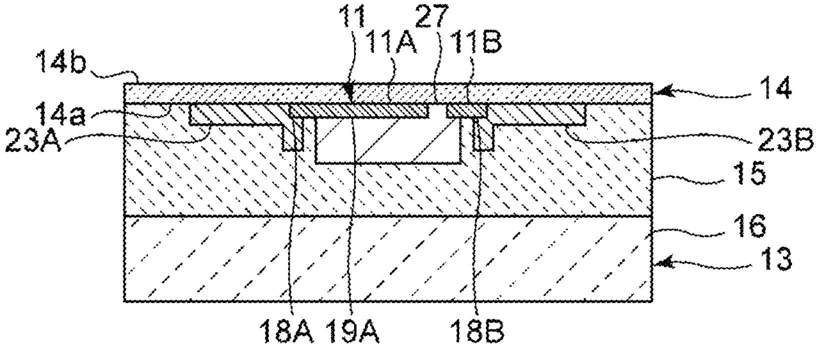

Next, a thickness of the piezoelectric substrate 24 is adjusted. To be more precise, the thickness of the piezoelectric substrate 24 is reduced by grinding or polishing the fourth principal surface 24*b* side of the piezoelectric substrate 24. Grinding, the CMP method, an ion slice method, etching, or the like can be used in adjusting the thickness of the piezoelectric substrate 24, for example. In this way, the piezoelectric layer 14 is obtained as shown in FIG. 6C. The first principal surface 14*a* of the piezoelectric layer 14 corresponds to the third principal surface 24*a* of the piezoelectric substrate 24. The second principal surface 14*b* of the piezoelectric layer 14 corresponds to the fourth principal surface 24*b* of the piezoelectric substrate 24.

Next, the frequency adjustment film 17 is provided on the second principal surface 14*b* of the piezoelectric layer 14. For example, the frequency adjustment film 17 can be formed in accordance with the sputtering method, the vacuum deposition method, or the like. Next, the thickness of the frequency adjustment film 17 is measured. An optical measurement or the like may be performed as a measurement of the thickness of the frequency adjustment film 17, for example.

Next, the frequency adjustment film 17 is ground as shown in FIG. 7A. In this instance, a first round of frequency adjustment is performed by adjusting the thickness of the frequency adjustment film 17 based on a result of the measurement of the thickness of the frequency adjustment film 17. For example, milling, dry etching, or the like may be used for grinding the frequency adjustment film 17. Meanwhile, regarding an acoustic wave device provided with multiple piezoelectric bulk wave devices, there is a case where the thicknesses of the frequency adjustment films 17 in the respective piezoelectric bulk wave devices are different. This case corresponds to a case where the acoustic wave device is a ladder filter and the acoustic wave device includes a piezoelectric bulk wave device being a serial arm resonator and a piezoelectric bulk wave device being a parallel arm resonator, for example. In the case where the thicknesses of the frequency adjustment films 17 vary depending on locations in the acoustic wave device as described above, locations other than the locations of the frequency adjustment films 17 to be subjected to the adjustment of the thickness are protected by using resist patterns at this stage, and then the grinding of the frequency adjustment films 17 is performed. Thereafter, the resist patterns are removed.

Next, as shown in FIG. 7B, the via holes 28 are provided to the piezoelectric layer 14 and the frequency adjustment film 17 so as to extend to the first connection electrode 23A and the second connection electrode 23B, respectively. For example, the via holes 28 can be formed in accordance with the Deep RIE (deep reactive ion etching) method and the like.

Next, as shown in FIG. 7C, the first wiring electrode 25A is continuously provided in one of the via holes 28 of the piezoelectric layer 14 and the frequency adjustment film 17 and on the frequency adjustment film 17. Thus, the first wiring electrode 25A is connected to the first connection electrode 23A. Moreover, the second wiring electrode 25B is continuously provided in another one of the via holes 28 and on the frequency adjustment film 17. Thus, the second wiring electrode 25B is connected to the second connection electrode 23B. For example, the first wiring electrode 25A and the second wiring electrode 25B can be formed in accordance with the lift-off method using the sputtering method, the vacuum deposition method, or the like.

Next, the first terminal electrode 26A is provided at a portion of the first wiring electrode 25A, which is provided on the frequency adjustment film 17. Moreover, the second terminal electrode 26B is provided at a portion of the second wiring electrode 25B, which is provided on the frequency adjustment film 17. For example, the first terminal electrode 26A and the second terminal electrode 26B can be formed, for example, in accordance with the lift-off method using the sputtering method, the vacuum deposition method, or the like.

Next, the through holes 29 are provided in the piezoelectric layer 14 and the frequency adjustment film 17 so as to extends to the sacrificial layer 27 as shown in FIG. 8A. For example, the through holes 29 can be formed in accordance with the Deep RIE method and the like.

Next, the sacrificial layer 27 is removed by using the through holes 29. To be precise, the sacrificial layer 27 inside the recess of the insulating layer 15 is removed by pouring in an etchant from the through holes 29. Thus, the hollow portion 13*a* is formed as shown in FIG. 8B.

Next, a second round of frequency adjustment is performed by trimming the frequency adjustment film 17 and adjusting the thickness of the frequency adjustment film 17. Accordingly, the piezoelectric bulk wave device 10 as shown in FIGS. 1 to 3 is obtained.

As shown in FIG. 3, in the present preferred embodiment, a thickness of a portion of the frequency adjustment film 17 which overlaps the hollow portion 13*a* in plan view is smaller than a thickness of a portion of the frequency adjustment film 17 which overlaps the first wiring electrode 25A in plan view. Similarly, the thickness of the portion of the frequency adjustment film 17 which overlaps the hollow portion 13*a* in plan view is smaller than a thickness of a portion of the frequency adjustment film 17 which overlaps the second wiring electrode 25B in plan view. The frequency adjustment is performed as described above after the process shown in FIG. 8B.

Figure 6D:
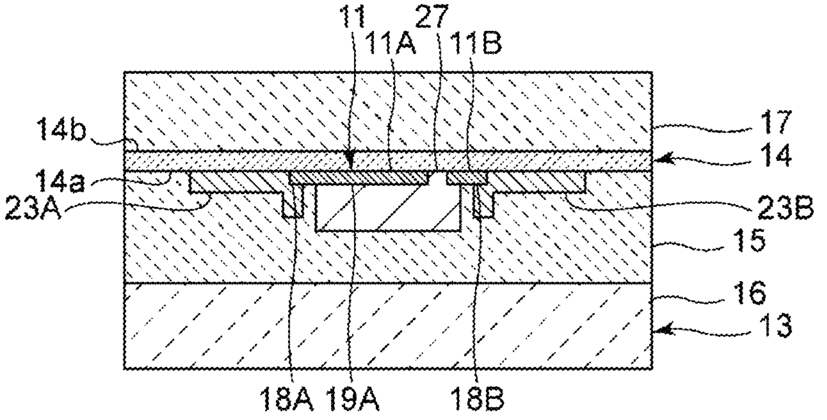

The frequency is adjusted twice in the above-described example of a method of manufacturing the piezoelectric bulk wave device 10. Here, the frequency adjustment film 17 is provided on the second principal surface 14*b* of the piezoelectric layer 14 as shown in FIG. 6D. In this instance, the IDT electrode 11, wiring, and the like are not provided on the second principal surface 14*b* side. For this reason, even when the frequency adjustment film 17 is provided so as to overlap IDT electrode 11 in plan view, the surface of the frequency adjustment film 17 on the region overlapping the IDT electrode 11 remains flat. In addition, the thickness of the frequency adjustment film 17 is adjusted based on the result of optically measuring the thickness of the frequency adjustment film 17. Thus, it is possible to adjust the thickness of the frequency adjustment film 17 uniformly and with high accuracy. Moreover, the thickness of the frequency adjustment film 17 is adjusted again after the process shown in FIG. 8B. Accordingly, it is possible to adjust the frequency of the piezoelectric bulk wave device 10 with even higher precision. The piezoelectric bulk wave device 10 can be suitably used for high-frequency filters and the like, which are required to fulfill the frequency adjustment with high accuracy.

As described above, the IDT electrode 11 is not provided to the second principal surface 14*b* of the piezoelectric layer 14 in the process shown in FIG. 6D. For this reason, it is possible to perform patterning when forming the frequency adjustment film 17 without considering unevenness on the surface of the piezoelectric layer 14 attributed to the IDT electrode 11 or the wiring, so that simple processes can be used. Moreover, the via holes 28 are formed simultaneously on the piezoelectric layer 14 and the frequency adjustment film 17 as shown in FIG. 7B, so that productivity can be improved.

Here, when trimming the frequency adjustment film 17 after the process shown in FIG. 8B, a portion of the frequency adjustment film 17 not overlapping the hollow portion 13*a* in plan view does not have to be trimmed. In this case, a resist pattern is provided on a portion on the frequency adjustment film 17 not overlapping the hollow portion 13*a* in plan view before trimming the frequency adjustment film 17, for example. In this resist pattern, a portion of the frequency adjustment film overlapping the hollow portion 13*a* in plan view is open. Next, the frequency adjustment film 17 may be trimmed by, for example, dry etching and the like, and then the resist pattern may be peeled off.

In this case, the thickness of the portion of the frequency adjustment film 17 overlapping the hollow portion 13*a* in plan view is smaller than the thickness of the portion not overlapping the hollow portion 13*a* in plan view.

Nonetheless, the frequency adjustment film 17 is subjected to the trimming while including the portion of the frequency adjustment film 17 not overlapping the hollow portion 13*a* in plan view in manufacturing the piezoelectric bulk wave device 10 of the present preferred embodiment. The frequency can be suitably adjusted in this case as well. The process of forming the resist pattern and the process of peeling off the resist pattern are not required in this case. Thus, productivity can be further improved.

Moreover, in the case of manufacturing the acoustic wave device including the piezoelectric bulk wave devices in which the thicknesses of the respective frequency adjustment films 17 are different, the process of adjusting the respective thicknesses of the frequency adjustment films 17 has been completed at the stage of the first round of frequency adjustment. Accordingly, when adjusting the thicknesses of the frequency adjustment films 17 after the process shown in FIG. 8B, the process of forming the resist pattern and the process of peeling off the resist pattern are not required in this case as well. Thus, productivity can be further improved.

Figure 9:
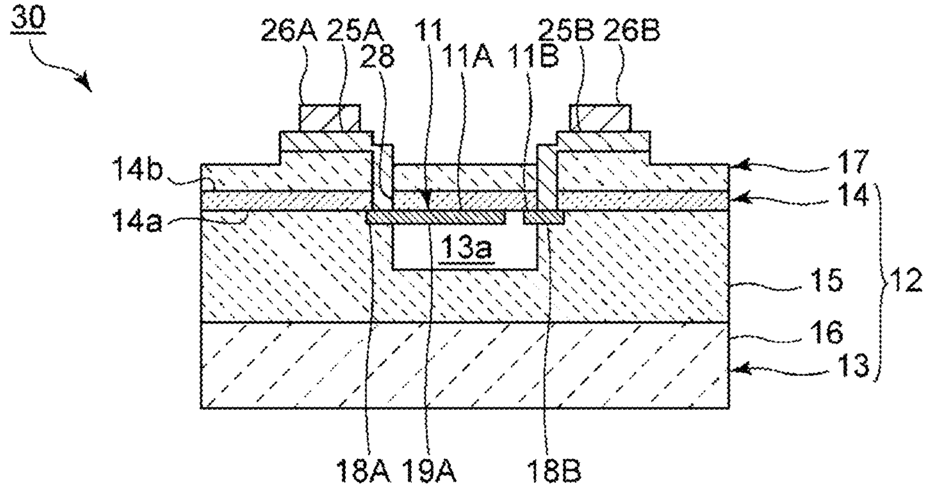
FIG. 9 is a schematic sectional view of a piezoelectric bulk wave device according to a second preferred embodiment of the present invention, which is taken along the electrode finger extending direction.

FIG. 9 is a sectional view of a piezoelectric bulk wave device according to a second preferred embodiment of the present invention, which is taken along the electrode finger extending direction.

The present preferred embodiment is different from the first preferred embodiment in that the first wiring electrode 25A is directly connected to the first busbar 18A of the first comb-shaped electrode 11A. The present preferred embodiment is also different from the first preferred embodiment in that the second wiring electrode 25B is directly connected to the second busbar 18B of the second comb-shaped electrode 11B. Except for these points, a piezoelectric bulk wave device 30 of the present preferred embodiment has the same or substantially the same configuration as that of the piezoelectric bulk wave device 10 of the first preferred embodiment.

One via hole 28 of the via holes 28 of the piezoelectric layer 14 and the frequency adjustment film 17 extends to the first busbar 18A. The first wiring electrode 25A is continuously provided in this via hole 28 of the piezoelectric layer 14 and on the frequency adjustment film 17. The first wiring electrode 25A is connected to the first busbar 18A. Another one of the via holes 28 extends to the second busbar 18B. The second wiring electrode 25B is continuously provided in this via hole 28 and on the frequency adjustment film 17. The second wiring electrode 25B is connected to the second busbar 18B. In the present preferred embodiment, the first connection electrode 23A and the second connection electrode 23B of the first preferred embodiment are not provided.

The present preferred embodiment can also perform the frequency adjustment with high accuracy as with the first preferred embodiment. An example of a method of manufacturing the piezoelectric bulk wave device 30 of the present preferred embodiment will be described below.

FIGS. 10A to 10D are schematic sectional views taken along the electrode finger extending direction for explaining an IDT electrode forming process, a sacrificial layer forming process, a first insulating layer forming process, and a first insulating layer planarizing process in an example of a method of manufacturing a piezoelectric bulk wave device according to a second preferred embodiment. FIGS. 11A to 11D are schematic sectional views taken along the electrode finger extending direction for explaining a frequency adjustment film forming process, a frequency adjustment film grinding process, a via hole forming process, a wiring electrode forming process, and a terminal electrode forming process in the example of the method of manufacturing a piezoelectric bulk wave device according to the second preferred embodiment.

Figure 10A:
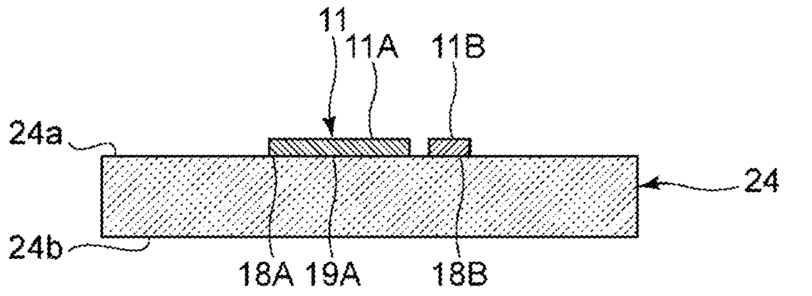
FIGS. 10A to 10D are schematic sectional views taken along the electrode finger extending direction for explaining an IDT electrode forming process, a sacrificial layer forming process, a first insulating layer forming process, and a first insulating layer planarizing process in an example of a method of manufacturing a piezoelectric bulk wave device according to the second preferred embodiment of the present invention.
Figure 10B:
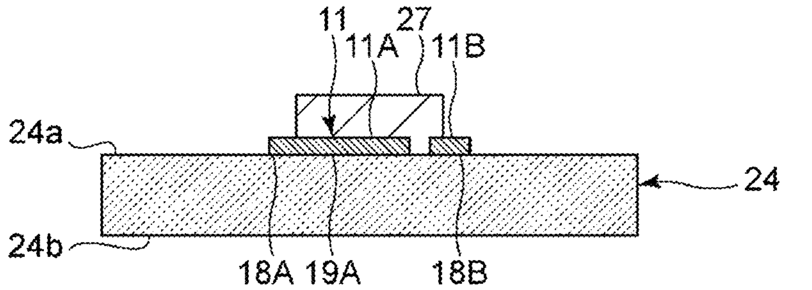

As shown in FIG. 10A, the piezoelectric substrate 24 is prepared as with the example of the method of manufacturing the piezoelectric bulk wave device 10 according to the first preferred embodiment. The IDT electrode 11 is provided on the third principal surface 24*a* of the piezoelectric substrate 24. Next, the sacrificial layer 27 is formed at the third principal surface 24*a* of the piezoelectric substrate 24 as shown in FIG. 10B. The sacrificial layer 27 is provided so as to cover the electrode fingers and at least part of the first busbar 18A and the second busbar 18B of the IDT electrode 11.

Figure 10C:
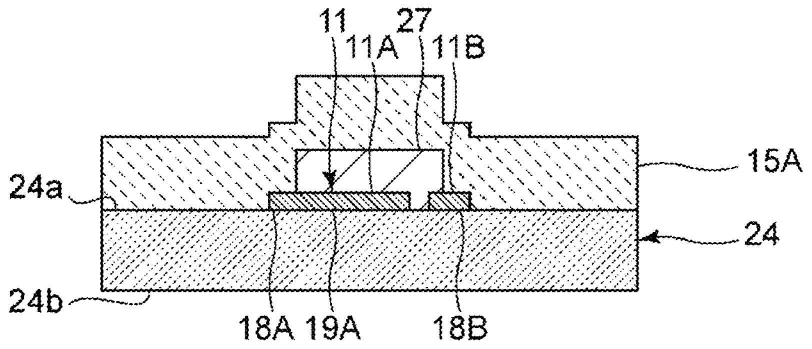
Figure 10D:
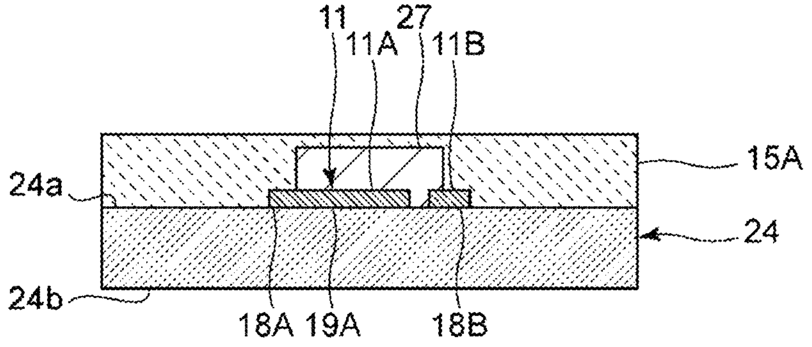

Next, the first insulating layer 15A is provided on the third principal surface 24*a* of the piezoelectric substrate 24 as shown in FIG. 10C. To be more precise, the first insulating layer 15A is provided so as to cover the IDT electrode 11 and the sacrificial layer 27. Next, the first insulating layer 15A is planarized as shown in FIG. 10D. Then, the support substrate 16 and the piezoelectric substrate 24 are joined in the same or similar manner to the method shown in FIGS. 6A and 6B. Next, the piezoelectric layer 14 is obtained as shown in FIG. 6C by adjusting the thickness of the piezoelectric substrate 24.

Figure 11A:
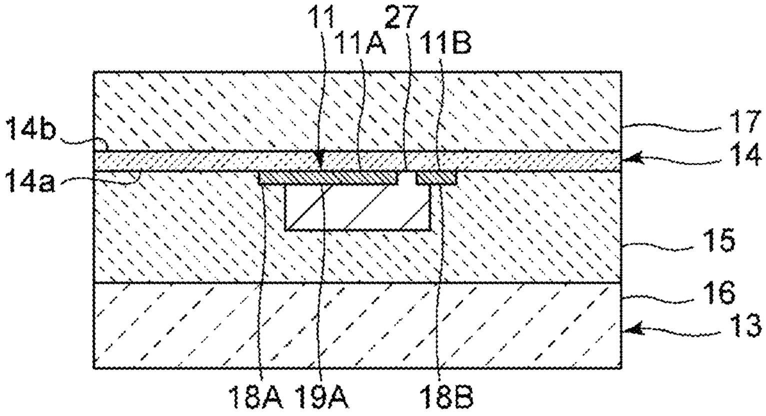
FIGS. 11A to 11D are schematic sectional views taken along the electrode finger extending direction for explaining a frequency adjustment film forming process, a frequency adjustment film grinding process, a via hole forming process, a wiring electrode forming process, and a terminal electrode forming process in an example of a method of manufacturing a piezoelectric bulk wave device according to the second preferred embodiment of the present invention.
Figure 11B:
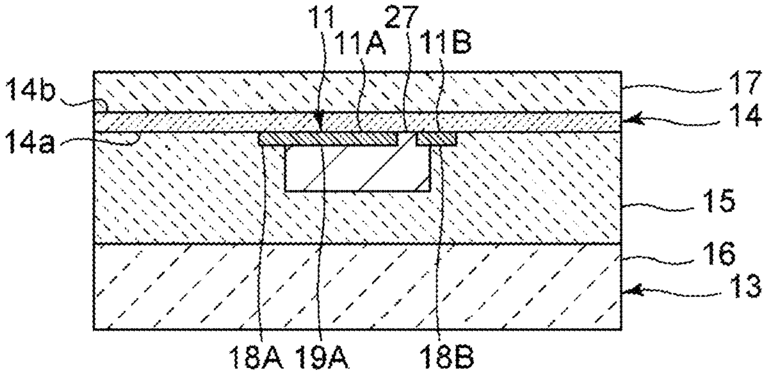

Next, the frequency adjustment film 17 is formed at the second principal surface 14*b* of the piezoelectric layer 14 as shown in FIG. 11A. Then, the thickness of the frequency adjustment film 17 is measured. Next, the frequency adjustment film 17 is ground as shown in FIG. 11B. In this instance, the thickness of the frequency adjustment film 17 is adjusted based on the result of the measurement of the thickness of the frequency adjustment film 17. Thus, the first round of frequency adjustment is performed. Meanwhile, in the case of manufacturing the acoustic wave device provided with the piezoelectric bulk wave devices in which the respective thicknesses of the frequency adjustment films 17 are different, the locations other than the locations of the frequency adjustment films 17 to be subjected to the adjustment of the thickness are protected by using the resist patterns at this stage, and then, for example, the grinding of the frequency adjustment films 17 is performed. Thereafter, the resist patterns are removed.

Figure 11C:
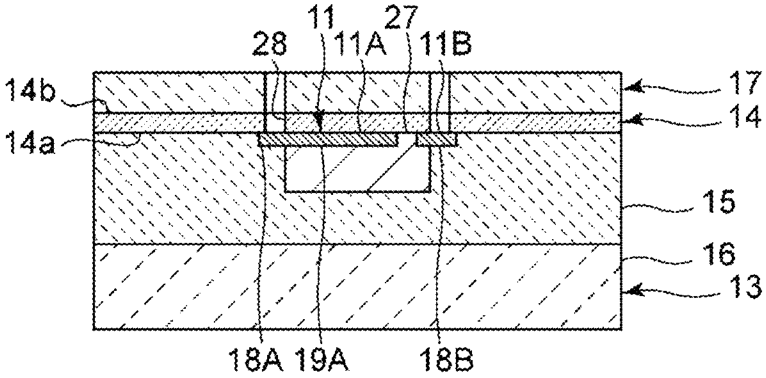
Figure 11D:
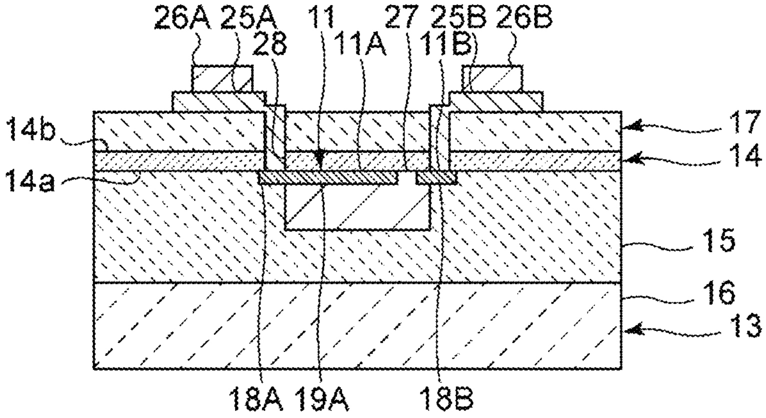

Next, as shown in FIG. 11C, the via holes 28 are provided on the piezoelectric layer 14 and the frequency adjustment film 17 so as to extend to the first busbar 18A and the second busbar 18B, respectively. Next, as shown in FIG. 11D, the first wiring electrode 25A is continuously provided in one of the via holes 28 of the piezoelectric layer 14 and on the frequency adjustment film 17. Thus, the first wiring electrode 25A is connected to the first busbar 18A. Moreover, the second wiring electrode 25B is continuously provided in another one of the via holes 28 and on the frequency adjustment film 17. Thus, the second wiring electrode 25B is connected to the second busbar 18B.

Processes subsequent thereto can be performed in the same or similar manner to the example of the above-described method of manufacturing the piezoelectric bulk wave device 10 according to the first preferred embodiment. Specifically, the second round of frequency adjustment is performed after the process shown in FIG. 11D. The frequency can also be adjusted with high accuracy in the present preferred embodiment as with the first preferred embodiment.

In the meantime, during manufacturing the piezoelectric bulk wave device 30 shown in FIG. 9, the portion of the frequency adjustment film 17 other than the portion provided with the first wiring electrode 25A and the second wiring electrode 25B is uniformly trimmed in the second round of frequency adjustment.

In the present preferred embodiment, the thicknesses of the portion of the frequency adjustment film 17 overlapping the first wiring electrode 25A and of the portion of the frequency adjustment film 17 overlapping the second wiring electrode 25B in plan view are larger than the thickness of the remaining portion of the frequency adjustment film 17. This is because the portion other than the portions of the frequency adjustment film 17 which overlap the first wiring electrode 25A and the second wiring electrode 25B is uniformly trimmed in the frequency adjustment as described above. In this case, the process of forming the resist pattern and the process of peeling off the resist pattern are not required in trimming the frequency adjustment film 17. Thus, productivity can be effectively improved.

Moreover, in the case of manufacturing the acoustic wave device including the piezoelectric bulk wave devices in which the thicknesses of the respective frequency adjustment films 17 are different, the process of adjusting the respective thicknesses of the frequency adjustment films 17 has been completed at the stage of the first round of frequency adjustment. Accordingly, the process of forming the resist pattern and the process of peeling off the resist pattern are not required in the second round of frequency adjustment in this case as well. Thus, productivity can be effectively improved.

In the first preferred embodiment and the second preferred embodiment, the piezoelectric bulk wave device is configured to be capable of using the bulk wave in the thickness-shear mode. Details of the thickness-shear mode will be described below. The piezoelectric bulk wave device is a type of the acoustic wave device. Accordingly, the piezoelectric bulk wave device may be referred to as the acoustic wave device in the following description as appropriate. The "electrode" in the following example corresponds to the electrode finger. The support in the following example corresponds to the support substrate.

Figure 12A:
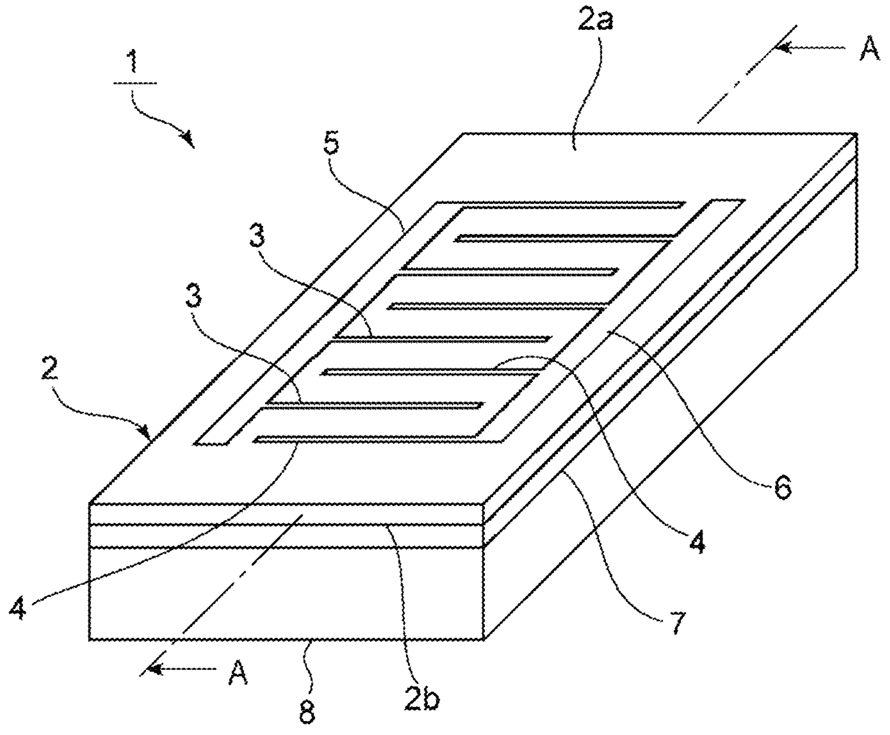
FIG. 12A is a schematic perspective view showing an external appearance of a piezoelectric bulk wave device that uses a bulk wave in a thickness-shear mode.
Figure 12B:
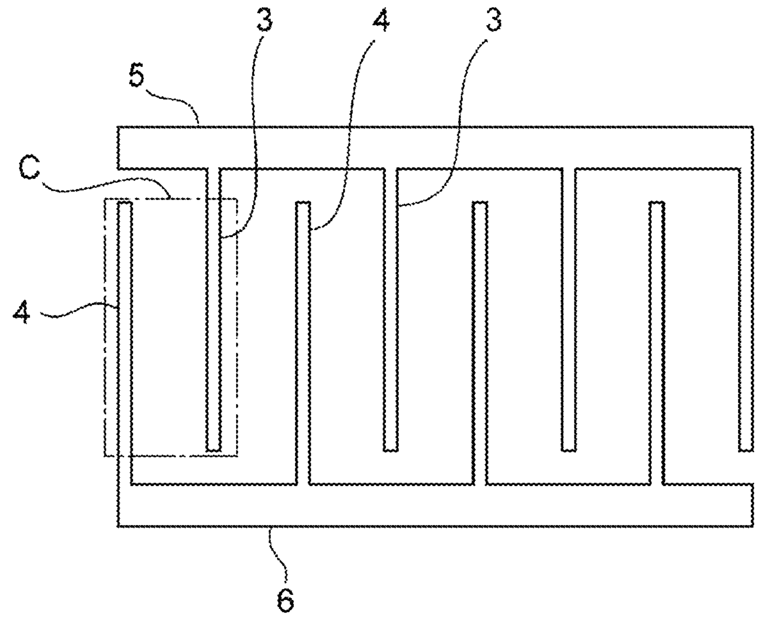
FIG. 12B is a plan view showing an electrode structure on a piezoelectric layer.
Figure 13:
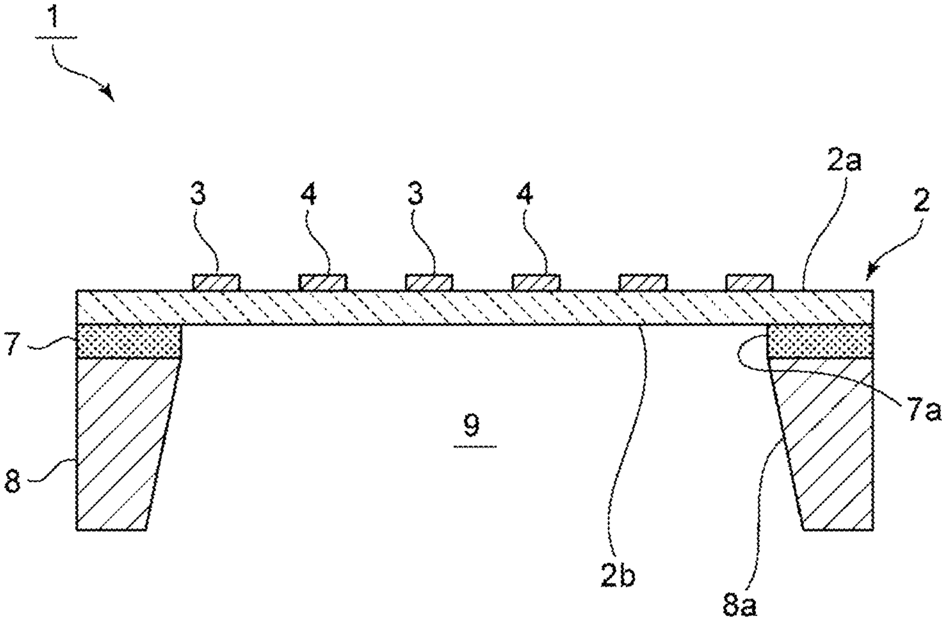
FIG. 13 is a sectional view of a portion taken along A-A line in FIG. 12A.

FIG. 12A is a schematic perspective view showing external appearance of an acoustic wave device that uses the bulk wave in the thickness-shear mode, FIG. 12B is a plan view showing an electrode structure on a piezoelectric layer, and FIG. 13 is a sectional view of a portion taken along A-A line in FIG. 12A.

An acoustic wave device 1 includes a piezoelectric layer 2 made of, for example, $LiNbO_3$. The piezoelectric layer 2 may be made of, for example, $LiTaO_3$ instead. Cut-angles of $LiNbO_3$ and $LiTaO_3$ are of Z-cut. Instead, the cut-angles may be of rotated Y-cut or of X-cut. Although a thickness of the piezoelectric layer 2 is not limited to a particular thickness, the thickness is preferably, for example, greater than or equal to about 40 nm and less than or equal to about 1000 nm, or more preferably greater than or equal to about 50 nm and less than or equal to about 1000 nm in order to effectively excite the thickness-shear mode. The piezoelectric layer 2 includes first and second principal surfaces 2*a* and 2*b* that are opposed to each other. Electrodes 3 and electrodes 4 are provided on the first principal surface 2*a*. Here, each electrode 3 is an example of a "first electrode" and each electrode 4 is an example of a "second electrode". In FIGS. 12A and 12B, the electrodes 3 are connected to a first busbar 5. The electrodes 4 are connected to a second busbar 6. The electrodes 3 and the electrodes 4 are interdigitated with one another. Each of the electrodes 3 and the electrodes 4 has a rectangular or substantially rectangular shape and extends in a longitudinal direction. An electrode 3 is opposed to an adjacent electrode 4 in a direction orthogonal or substantially orthogonal to this longitudinal direction. Each of the longitudinal direction of the electrodes 3 and 4 and the direction orthogonal or substantially orthogonal to the longitudinal direction of the electrodes 3 and 4 is a direction crossing a thickness direction of the piezoelectric layer 2. Accordingly, the electrode 3 and the adjacent electrode 4 can be considered to be opposed to each other in the direction crossing the thickness direction of the piezoelectric layer 2. Alternatively, the longitudinal direction of the electrodes 3 and 4 may be replaced with the direction orthogonal or substantially orthogonal to the longitudinal direction of the electrodes 3 and 4 as shown in FIGS. 12A and 12B. In other words, the electrodes 3 and 4 may extend in a direction of extension of the first busbar 5 and the second busbar 6 in FIGS. 12A and 12B. In this case, the first busbar 5 and the second busbar 6 extend in the direction of extension of the electrodes 3 and 4 in FIGS. 12A and 12B. In the meantime, pairs of structures each including a pair of the electrode 3 connected to one electric potential and the electrode 4 connected to another electric potential being adjacent to each other are provided in the direction orthogonal or substantially orthogonal to the longitudinal direction of the electrodes 3 and 4 described above. Here, the state of the electrode 3 and the electrode 4 being adjacent to each other does not mean a case where the electrode 3 and the electrode 4 are disposed in direct contact but means a case where the electrode 3 and the electrode 4 are disposed with a clearance therebetween. Moreover, in the case where the electrode 3 and the electrode 4 are adjacent to each other, electrodes inclusive of other electrodes 3 and 4 to be connected to hot electrodes or ground electrodes are not disposed between the relevant electrodes 3 and 4. The number of pairs does not always have to represent integer pairs but may represent 1.5 pairs, 2.5 pairs, and the like. A center-to-center distance, namely, a pitch between the electrodes 3 and 4 is preferably in a range of, for example, greater than or equal to about 1 μm and less than or equal to about 10 μm. In the meantime, a width of the electrodes 3 and 4, that is, a dimension in the opposing direction of the electrodes 3 and 4 is preferably in a range of, for example, greater than or equal to about 50 nm and less than or equal to about 1000 nm, or more preferably in a range of greater than or equal to about 150 nm and less than or equal to about 1000 nm. Here, the center-to-center distance between the electrodes 3 and 4 is equivalent to the distance of connection between the center of the dimension (the width dimension) of the electrode 3 in the direction orthogonal or substantially orthogonal to the longitudinal direction of the electrode 3 and the center of the dimension (the width dimension) of the electrode 4 in the direction orthogonal or substantially orthogonal to the longitudinal direction of the electrode 4.

Meanwhile, since the acoustic wave device 1 uses the piezoelectric layer of the Z-cut, the direction orthogonal or substantially orthogonal to the longitudinal direction of the electrodes 3 and 4 is equivalent to a direction orthogonal or substantially orthogonal to a direction of polarization of the piezoelectric layer 2. This is not true of a case where a piezoelectric body of a different cut-angle is used as the piezoelectric layer 2. Here, the term "orthogonal" is not limited only to a case of being strictly orthogonal but also includes a case of being substantially orthogonal (where an angle formed between the direction orthogonal to the longitudinal direction of the electrodes 3 and 4 and the direction of polarization is in a range of about 90°±10°, for example).

A support 8 is laminated on the second principal surface 2*b* side of the piezoelectric layer 2 with an insulating layer 7 interposed therebetween. The insulating layer 7 and the support 8 each have a frame shape and are provided with through holes 7*a* and 8*a* as shown in FIG. 13, thus providing a cavity portion 9. The cavity portion 9 is provided in order not to disturb vibration of an excitation region C of the piezoelectric layer 2. Accordingly, the above-described support 8 is laminated on the second principal surface 2*b* with the insulating layer 7 interposed therebetween at a position not overlapping at least a portion provided with a pair of the electrodes 3 and 4. Here, the insulating layer 7 does not always have to be provided. Accordingly, the support 8 may be laminated either directly or indirectly on the second principal surface 2*b* of the piezoelectric layer 2.

The insulating layer 7 is made of, for example, silicon oxide. Nonetheless, it is possible to use an appropriate insulating material such as, for example, silicon oxynitride and alumina besides silicon oxide. The support 8 is made of, for example, Si. A plane orientation of a surface on the piezoelectric layer 2 side of Si may be of (100), (110), or (111). It is preferable that Si of the support 8 has high resistance with resistivity greater than or equal to about 4 kΩcm, for example. Nonetheless, the support 8 can also be made using an appropriate insulating material or an appropriate semiconductor material as well.

For example, any of piezoelectric bodies such as aluminum oxide, lithium tantalate, lithium niobate, and quartz, various ceramics such as alumina, magnesia, sapphire, silicon nitride, aluminum nitride, silicon carbide, zirconia, cordierite, mullite, steatite, and forsterite, dielectrics such as diamond and glass, and semiconductors such as gallium nitride can be used as the material of the support 8.

The above-described electrodes 3 and 4 and the first and second busbars 5 and 6 are made of an appropriate metal or an alloy such as Al and AlCu alloy, for example. In the present preferred embodiment, the electrodes 3 and 4 and the first and second busbars 5 and 6 have a structure obtained by laminating an Al film on a Ti film, for example. Here, an adhesion layer other than the Ti film may be used instead.

An alternating-current voltage is applied between the electrodes 3 and the electrodes 4 when driving. To be more precise, the alternating-current voltage is applied between the first busbar 5 and the second busbar 6. Thus, it is considered possible to obtain resonance characteristics by using the bulk wave in the thickness-shear mode excited in the piezoelectric layer 2. Meanwhile, in the acoustic wave device 1, for example, the d/p is set less than or equal to about 0.5 when the thickness of the piezoelectric layer 2 is defined as d and the center-to-center distance of certain electrodes 3 and 4 being adjacent to each other out of the multiple pairs of the electrodes 3 and 4 is defined as p. Accordingly, the above-described bulk wave in the thickness-shear mode is effectively excited so that favorable resonance characteristics can be obtained. More preferably, for example, the d/p is less than or equal to 0.24. In this case, it is possible to obtain even more favorable resonance characteristics.

Since the acoustic wave device 1 includes the above-described configuration, a decrease in Q factor is less likely to occur even when the number of pairs of the electrodes 3 and 4 is reduced in an attempt to downsize. This is attributed to a small propagation loss even when the number of the electrode fingers in the reflectors on both sides is reduced. In addition, the number of the above-described electrode fingers can be reduced because of the use of the bulk wave in the thickness-shear mode. A difference between the Lamb wave used by the acoustic wave device and the bulk wave in the thickness-shear mode described above will be described with reference to FIGS. 14A and 14B.

Figure 14A:
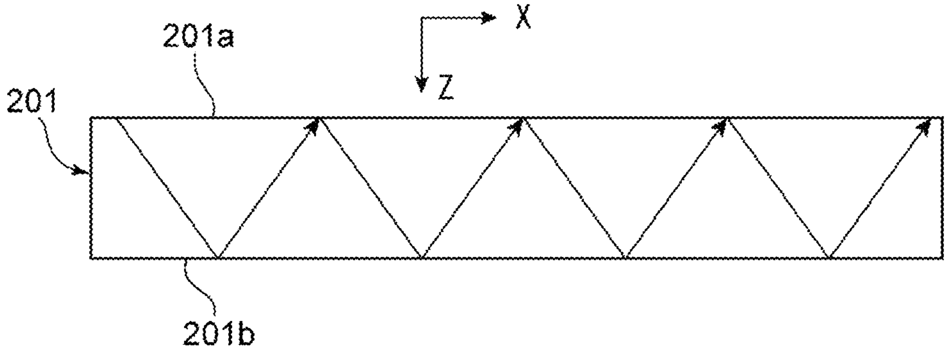
FIG. 14A is a schematic elevational sectional view for explaining a Lamb wave propagating in a piezoelectric film of a piezoelectric bulk wave device and FIG. 14B is a schematic elevational sectional view for explaining a bulk wave in the thickness-shear mode propagating in the piezoelectric film of the piezoelectric bulk wave device.

FIG. 14A is a schematic elevational sectional view for explaining a Lamb wave propagating in a piezoelectric film of an acoustic wave device as described in Japanese Unexamined Patent Application Publication No. 2012-257019. Here, a wave propagates as indicated with an arrow in a piezoelectric film 201. Here, in the piezoelectric film 201, a first principal surface 201*a* and a second principal surface 201*b* are opposed to each other, and a thickness direction connecting the first principal surface 201*a* to the second principal surface 201*b* is equivalent to z direction. X direction is a direction of arrangement of electrode fingers of an IDT electrode. As shown in FIG. 14A, in the Lamb wave, the wave propagates in the x direction as illustrated therein. Being a plate wave, the piezoelectric film 201 vibrates as a whole whereas the wave propagates in the x direction. Accordingly, resonance characteristics are obtained by disposing reflectors on both sides. For this reason, a propagation loss of the wave occurs and a Q factor is therefore deceased in an attempt to downsize, that is, in a case of reducing the number of pairs of the electrode fingers.

Figure 14B:
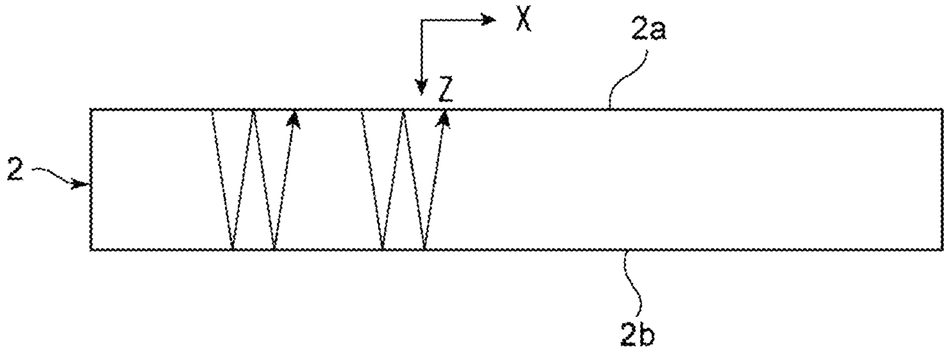

In contrast, vibration displacement occurs in the thickness-shear direction in the acoustic wave device 1, and the wave substantially propagates and resonates in a direction of connection of the first principal surface 2*a* to the second principal surface 2*b* of the piezoelectric layer 2, that is to say, in the z direction as shown in FIG. 14B. In other words, a component in the x direction of the wave is considerably smaller than a component in the z direction thereof. Moreover, the resonance characteristics are obtained from this propagation of the wave in the z direction. Accordingly, a propagation loss hardly occurs even when the number of electrode fingers of the reflectors is reduced. Moreover, the Q factor is hardly decreased even when the number of electrode pairs including the electrodes 3 and 4 is reduced in an attempt to downsize.

Figure 15:
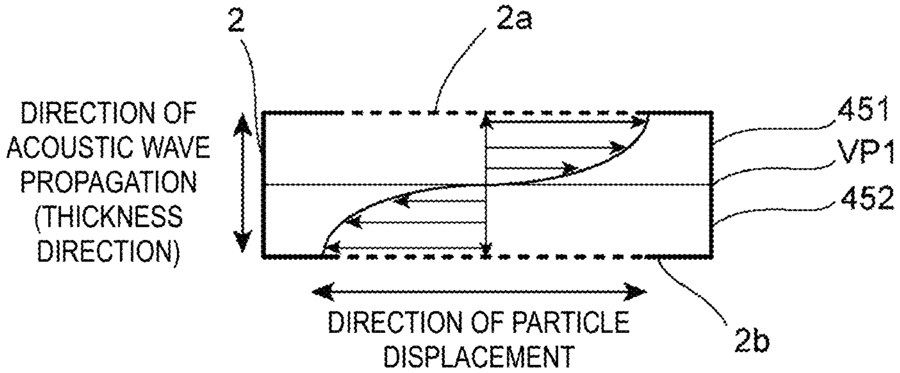
FIG. 15 is a diagram showing a direction of amplitude of the bulk wave in the thickness-shear mode.

Here, a direction of amplitude of the bulk wave in the thickness-shear mode in a first region 451 included in the excitation region C of the piezoelectric layer 2 is inverted from that in a second region 452 included in the excitation region C as shown in FIG. 15. FIG. 15 schematically shows the bulk wave in a case where a voltage having a higher electric potential at the electrode 4 than that at the electrode 3 is applied between the electrode 3 and the electrode 4. The first region 451 is a region within the excitation region C which is located between a virtual plane VP1 that extends orthogonally or substantially orthogonally to the thickness direction of the piezoelectric layer 2 while bisecting the piezoelectric layer 2 and the first principal surface 2*a*. The second region 452 is a region within the excitation region C which is located between the virtual plane VP1 and the second principal surface 2*b*.

As described above, at least one pair of electrodes including the electrode 3 and the electrode 4 is provided at the acoustic wave device 1. However, the number of electrode pairs including the electrodes 3 and 4 does not always have to be more than one pair because the electrodes are not designed to cause the wave to propagate in the x direction. In other words, at least one pair of electrodes is sufficient.

For example, the electrode 3 described above is an electrode to be connected to a hot potential and the electrode 4 is an electrode to be connected to a ground potential. Nonetheless, the electrode 3 may be connected to the ground potential while the electrode 4 may be connected to the hot potential. In the present preferred embodiment, at least one pair of electrodes include the electrode to be connected to the hot potential or the electrode to be connected to the ground potential, and no floating electrodes are provided therein.

Figure 16:
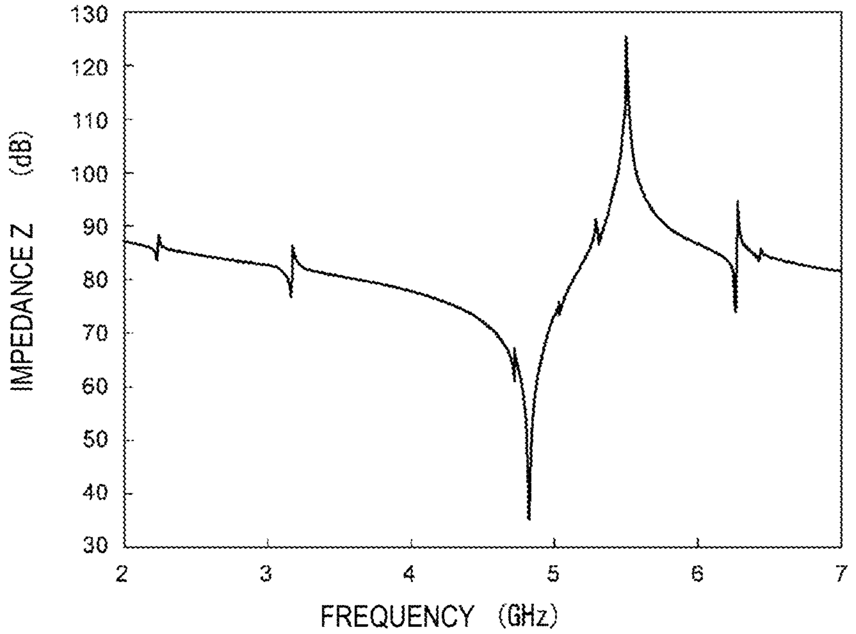
FIG. 16 is a diagram showing resonance characteristics of the piezoelectric bulk wave device that uses the bulk wave in the thickness-shear mode.

FIG. 16 is a diagram showing resonance characteristics of the acoustic wave device shown in FIG. 13. Here, design parameters of the acoustic wave device 1 having obtained these resonance characteristics are as follows:

piezoelectric layer 2: $LiNbO_3$ having the Euler angles (0°, 0°, 90°), thickness=about 400 nm; when viewed in the direction orthogonal to the longitudinal direction of the electrode 3 and the electrode 4, the length of the region where the electrode 3 overlaps the electrode 4, that is, the excitation region C=about 40 μm, the number of pairs of electrodes including the electrodes 3 and 4=21 pairs, a distance between the centers of the electrodes=about 3 μm, the width of the electrodes 3 and 4=about 500 nm, and the d/p=about 0.133;

insulating layer 7: a silicon oxide film having a thickness of about 1 μm; and support 8: Si.

Here, the length of the excitation region C is a dimension of the excitation region C in the longitudinal direction of the electrodes 3 and 4.

In the present preferred embodiment, all of the distances between electrodes in electrode pairs including the electrodes 3 and 4 are set to be equal or substantially equal. Specifically, the electrodes 3 and the electrodes 4 are disposed at equal or substantially equal pitches.

As is clear from FIG. 16, fine resonance characteristics with the fractional bandwidth of about 12.5% are obtained in spite of not being provided with the reflectors.

In addition, when the thickness of the above-described piezoelectric layer 2 is defined as d and the center-to-center distance of the electrodes of the electrode 3 and the electrode 4 is defined as p, the d/p is, for example, less than or equal to about 0.5 or preferably less than or equal to about 0.24 in the present preferred embodiment. This will be described with reference to FIG. 17.

Figure 17:
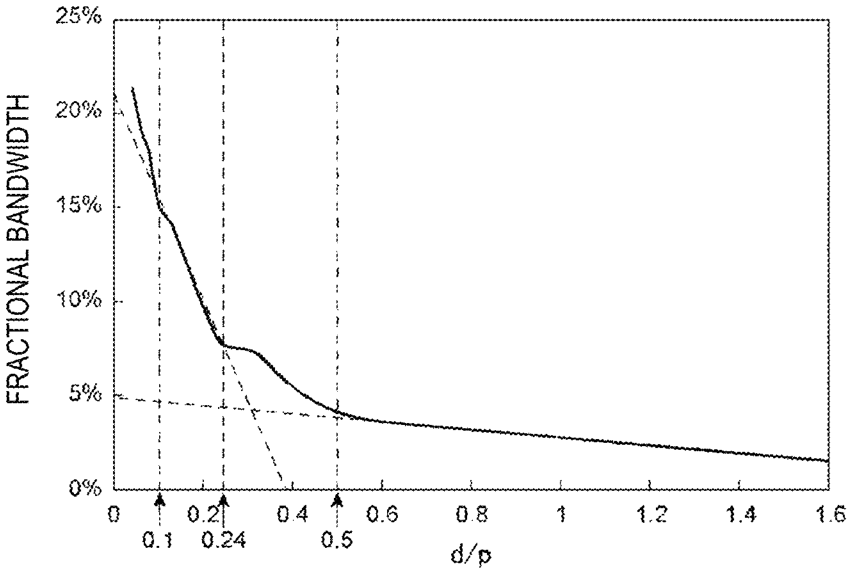
FIG. 17 is a diagram showing a relation between d/p and a fractional bandwidth as a resonator in a case where a center-to-center distance between adjacent electrodes is defined as p and a thickness of the piezoelectric layer is defined as d.

As with the acoustic wave device having obtained the resonance characteristics shown in FIG. 16, acoustic wave devices are obtained while changing the d/p. FIG. 17 is a diagram showing a relation between the d/p and the fractional bandwidth as a resonator of each of the acoustic wave devices.

As is clear from FIG. 17, when the d/p>about 0.5, the fractional bandwidth falls below about 5% even when the d/p is adjusted. On the other hand, when the d/p≤about 0.5, the fractional bandwidth can be set greater than or equal to about 5% by changing the d/p within this range. In other words, it is possible to configure the resonator having a high coupling coefficient. In addition, when the d/p is less than or equal to about 0.24, it is possible to increase the fractional bandwidth greater than or equal to about 7%. In addition, by adjusting the d/p within this range, it is possible to obtain the resonator having an even wider fractional bandwidth, so that the resonator having an even higher coupling coefficient can be achieved. Accordingly, it turns out that the resonator having the high coupling coefficient by using the bulk wave in the above-described thickness-shear mode can be configured by, for example, setting the d/p less than or equal to about 0.5.

Figure 18:
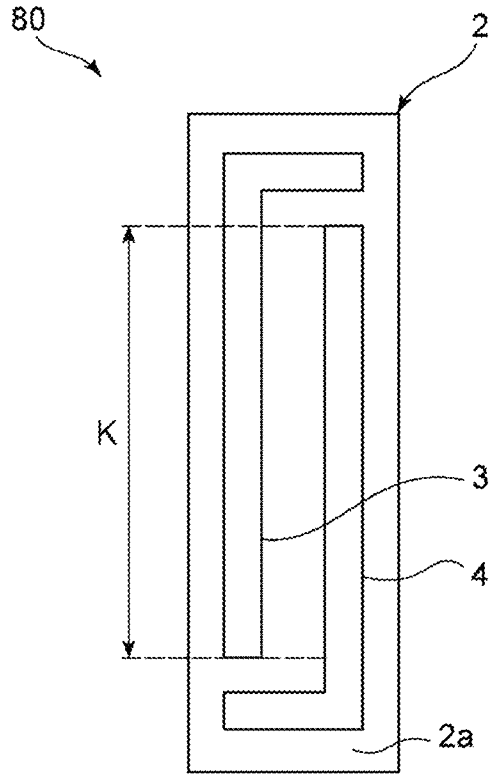
FIG. 18 is a plan view showing a piezoelectric bulk wave device that uses the bulk wave in the thickness-shear mode.

FIG. 18 is a plan view of an acoustic wave device that uses the bulk wave in the thickness-shear mode. In an acoustic wave device 80, a pair of electrodes including the electrodes 3 and 4 are provided on the first principal surface 2*a* of the piezoelectric layer 2. Here, K in FIG. 18 represents a crossing width. As described above, in the acoustic wave device of the present invention, the number of pairs of electrodes may be one. In this case as well, it is possible to effectively excite the bulk wave in the thickness-shear mode when the above-described d/p is less than or equal to about 0.5, for example.

Figure 19:
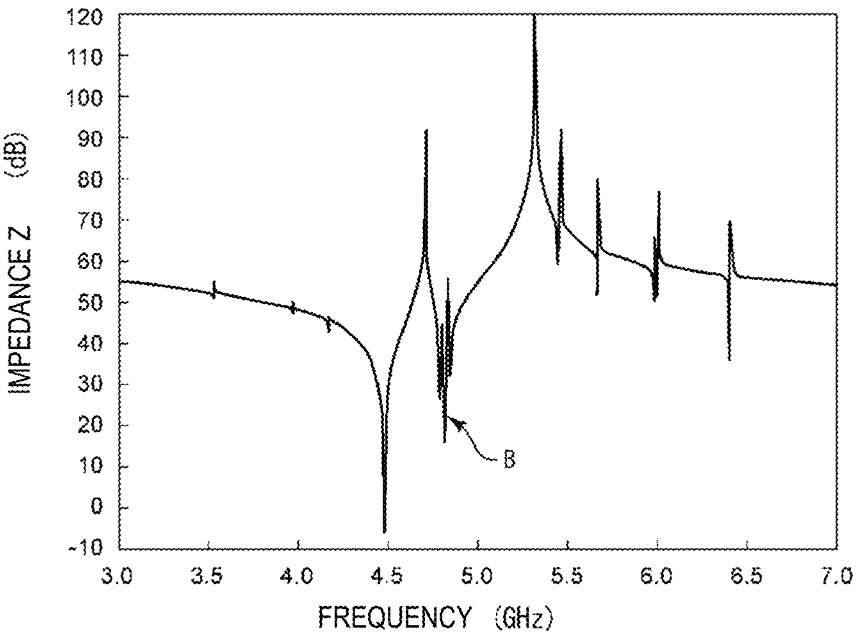
FIG. 19 is a diagram showing resonance characteristics of a piezoelectric bulk wave device of a reference example in which a spurious emission appears.

Preferably, in the acoustic wave device 1, a metallization ratio MR of any of the electrodes 3 and 4 being adjacent each other of the multiple electrodes 3 and 4 relative to the excitation region C being the overlapping region when viewed in the direction of opposition of the electrodes 3 and 4 being adjacent to each other preferably satisfies MR about 1.75 (d/p)+0.075, for example. In this case, spurious emission can be reduced effectively. This will be described with reference FIGS. 19 and 20. FIG. 19 is a reference diagram showing an example of the resonance characteristics of the above-described acoustic wave device 1. The spurious emission indicated with an arrow B appears between a resonant frequency and an anti-resonant frequency. Here, the d/p is set equal to about 0.08 and the Euler angles of $LiNbO_3$ are set to (0°, 0°, 90°). Meanwhile, the metallization ratio MR is set equal to about 0.35, for example.

The metallization ratio MR will be described with reference to FIG. 12B. When attention is drawn to one pair of the electrodes 3 and 4 in the electrode structure in FIG. 12B, only this pair of the electrodes 3 and 4 is assumed to be provided. In this case, a portion surrounded by a chain line defines the excitation region C. This excitation region C is equivalent to a region of the electrode 3 overlapping the electrode 4, a region of the electrode 4 overlapping the electrode 3, and a region between the electrode 3 and the electrode 4 where the electrode 3 and the electrode 4 overlap each other when the electrode 3 and the electrode 4 are viewed in the direction orthogonal to the longitudinal direction of the electrodes 3 and 4, that is, in the opposing direction. Moreover, a ratio of the area of the electrodes 3 and 4 in this excitation region C relative to the area of the excitation region C is equivalent to the metallization ratio MR. In other words, the metallization ratio MR is equivalent to a ratio of the area of a metallization portion to the area of the excitation region C.

Here, in the case where more than one pair of electrodes are provided, MR may be defined as a ratio of the metallization portions included in all of the excitation regions to a sum of the areas of the excitation regions.

Figure 20:
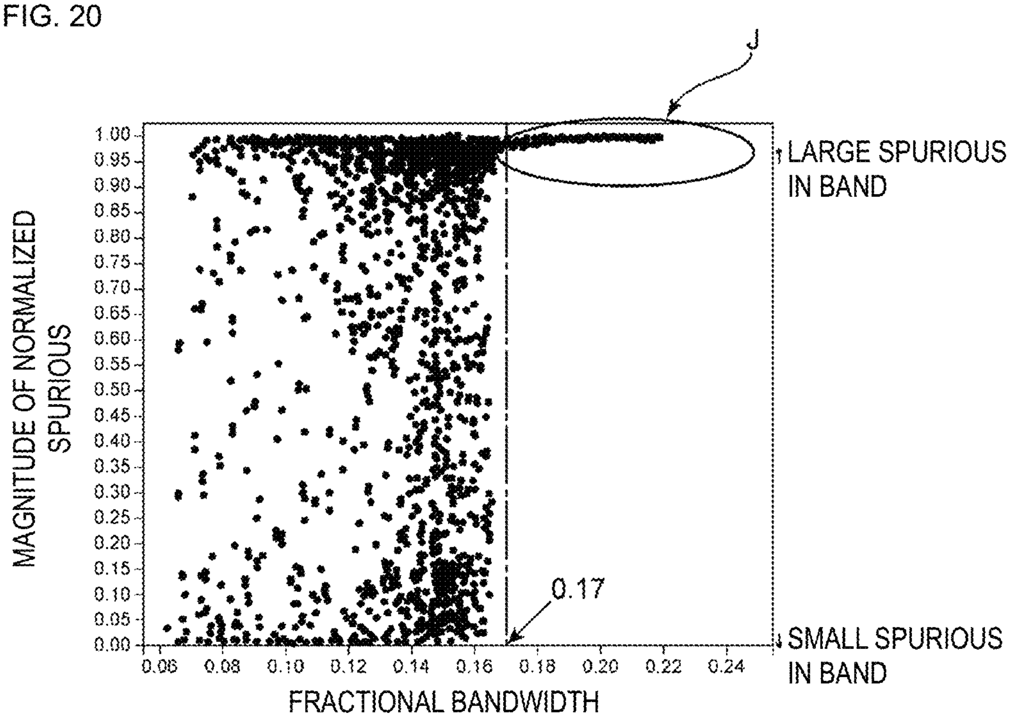
FIG. 20 is a diagram showing a relation between the fractional bandwidth and an amount of phase rotation of impedance of a spurious emission normalized at about 180 degrees as a magnitude of the spurious emission.

FIG. 20 is a diagram showing a relationship between the fractional bandwidth and an amount of phase rotation of impedance of the spurious emission normalized at about 180 degrees as a magnitude of the spurious emission when numerous acoustic wave resonators are provided according to the present preferred embodiment. Here, the fractional bandwidth is adjusted by changing a film thickness of the piezoelectric layer and dimensions of the electrodes in various ways. Although FIG. 20 shows a result in the case of using the piezoelectric layer made of Z-cut $LiNbO_3$, a result has a similar tendency in a case of using a piezoelectric layer of a different cut-angle as well.

The spurious emission reaches as large as about 1.0 in a region surrounded by an ellipse J in FIG. 20. As is clear from FIG. 20, when the fractional bandwidth exceeds about 0.17, that is, when it exceeds about 17%, large spurious emission having a spurious level greater than or equal to about 1 appears in a pass band even when parameters constituting the fractional bandwidth are changed. Specifically, the large spurious emission indicated with the arrow B appears in the band like the resonance characteristics shown in FIG. 19. Therefore, the fractional bandwidth is preferably, for example, less than or equal to about 17%. In this case, it is possible to reduce the spurious emission by adjusting the film thickness of the piezoelectric layer 2, the dimensions of the electrodes 3 and 4, and the like.

Figure 21:
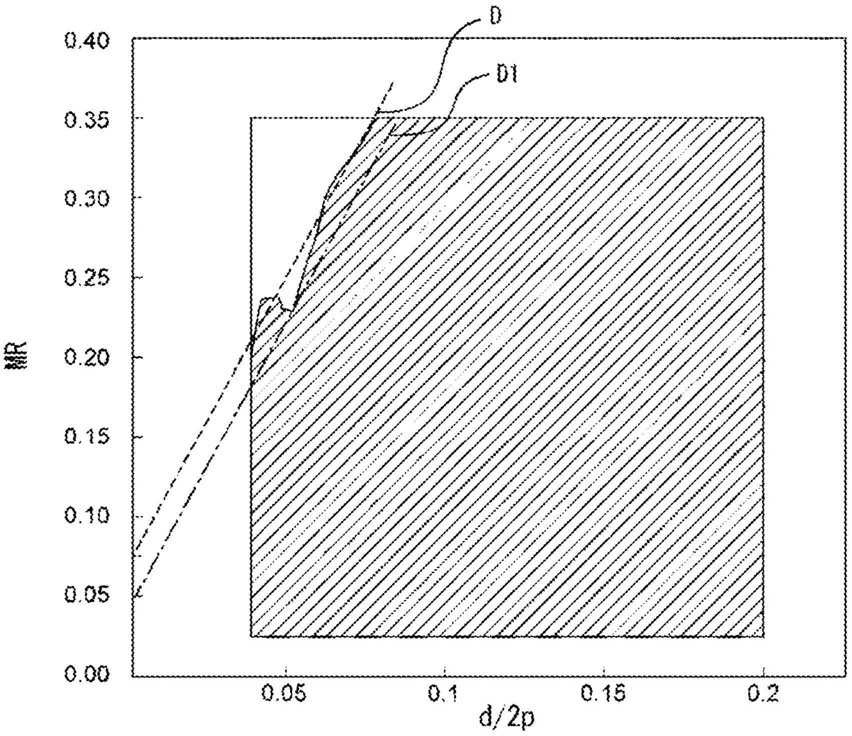
FIG. 21 is a diagram showing a relation between d/2p and a metallization ratio MR.

FIG. 21 is a diagram showing a relationship among d/2p, the metallization ratio MR, and the fractional bandwidth. Regarding the above-described acoustic wave device, various acoustic wave devices having different values of d/2p and MR are configured and fractional bandwidths thereof are measured. A portion indicated with hatching on the right side of a dashed line D in FIG. 21 is a region where the fractional bandwidth is less than or equal to about 17%. A boundary between the portion with this hatching and a portion without the hatching is expressed by MR=about 3.5(d/2p)+0.075, that is, MR=about 1.75 (d/p)+0.075. Accordingly, for example, MR about 1.75 (d/p)+0.075 is preferable. In this case, the fractional bandwidth can be set less than or equal to about 17% easily. A region on the right side of MR=about 3.5(d/2p)+0.05 indicated with a chain line D1 in FIG. 21 is more preferable, for example. In other words, the fractional bandwidth can surely be set less than or equal to about 17% when MR about 1.75 (d/p)+0.05 is satisfied.

Figure 22:
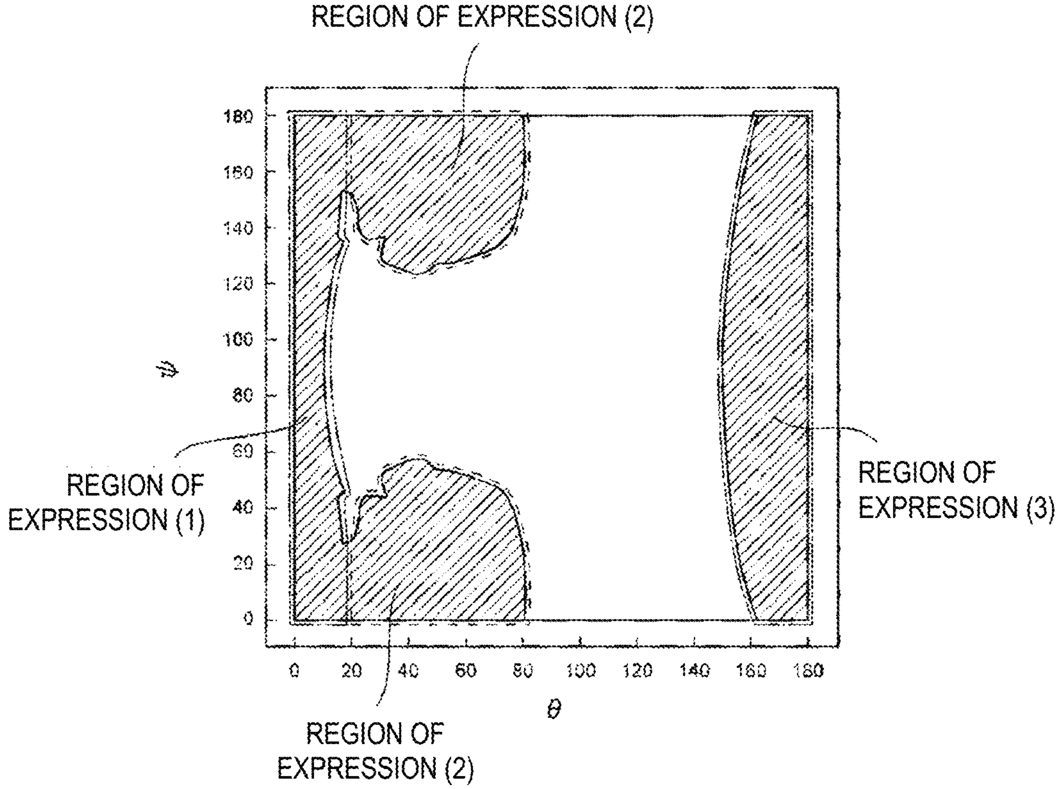
FIG. 22 is a diagram showing maps of fractional bandwidths relative to Euler angles (0°, θ, ψ) of $LiNbO_3$ in a case of bringing the d/p infinitesimally close to 0.

FIG. 22 is a diagram showing a map of the fractional bandwidths relative to Euler angles (0°, θ, ψ) of $LiNbO_3$ when bringing the d/p infinitesimally close to 0. Portions indicated with hatching in FIG. 22 are regions where the fractional bandwidths of at least greater than or equal to about 5% are available. When ranges of these regions are approximated, the ranges are expressed by expression (1), expression (2), and expression (3) below.

$$(0°±10°, 0° \text{ to } 20°, \text{any } \psi) \quad \text{expression (1)}$$

$$(0°±10°, 20° \text{ to } 80°, 0° \text{ to } 60° (1-(\theta-50)^2/900)^{1/2}) \text{ or } (0°±10°, 20° \text{ to } 80°, [180°-60° (1-(\theta-50)^2/900)^{1/2}] \text{ to } 180°) \quad \text{expression (2)}$$

$$(0°±10°, [180°-30°(1-(\psi-90)^2/8100)^{1/2}] \text{ to } 180°, \text{any } \psi) \quad \text{expression (3)}$$

Accordingly, the fractional bandwidth can be sufficiently widened and it is therefore preferable in the case where the range of the Euler angles is any of the expression (1), the expression (2), and the expression (3) mentioned above. The same applies to the case where the piezoelectric layer 2 is the lithium tantalate layer.

As described above, for example, the d/p less than or equal to about 0.24 is preferable in the piezoelectric bulk wave device of the first preferred embodiment or the second preferred embodiment, which uses the bulk wave in the thickness-shear mode. This makes it possible to obtain even more favorable resonance characteristics. Moreover, for example, MR about 1.75 (d/p)+0.075 is preferably satisfied as described above in the piezoelectric bulk wave device of the first preferred embodiment or the second preferred embodiment, which uses the bulk wave in the thickness-shear mode. In this case, it is possible to reduce or prevent the spurious emission more reliably.

The piezoelectric layer in the piezoelectric bulk wave device of the first preferred embodiment or the second preferred embodiment, which uses the bulk wave in the thickness-shear mode, is preferably, for example, the lithium niobate layer or the lithium tantalate layer. Moreover, the Euler angles ($\phi$, $\theta$, $\psi$) of lithium niobate or lithium tantalate constituting the piezoelectric layer preferably fall in the range defined by any of the expression (1), the expression (2), and the expression (3) mentioned above. In this case, the fractional bandwidth can be sufficiently widened.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric bulk wave device comprising:

a support including a support substrate;

a piezoelectric layer on the support and including a first principal surface located on a support side and a second principal surface opposed to the first principal surface;

an IDT electrode on the first principal surface of the piezoelectric layer and including a pair of comb-shaped electrodes each including at least one electrode finger of a plurality of electrode fingers and a busbar connecting one end of the at least one electrode finger; and a frequency adjustment film on the second principal surface of the piezoelectric layer and overlapping at least a portion of the IDT electrode in plan view; wherein the support includes a hollow portion overlapping at least a portion of the IDT electrode in plan view;

where a thickness of the piezoelectric layer is defined as d and a center-to-center distance between electrode fingers adjacent to each other is defined as p, d/p is less than or equal to about 0.5;

a plurality of via holes are provided to the piezoelectric layer and the frequency adjustment film; and the piezoelectric bulk wave device further includes a plurality of wiring electrodes in the respective via holes of the piezoelectric layer and the frequency adjustment film and on the frequency adjustment film and electrically connected to the busbars of the comb-shaped electrodes.

2. The piezoelectric bulk wave device according to claim 1, wherein the support includes an insulating layer between the support substrate and the piezoelectric layer.

3. The piezoelectric bulk wave device according to claim 1, further comprising:

a plurality of connection electrodes on the first principal surface of the piezoelectric layer and connected to the comb-shaped electrodes; wherein the wiring electrodes in the via holes are connected to the connection electrodes.

4. The piezoelectric bulk wave device according to claim 1, wherein the wiring electrodes in the via holes are connected to the comb-shaped electrodes.

5. The piezoelectric bulk wave device according to claim 1, wherein the d/p is less than or equal to about 0.24.

6. The piezoelectric bulk wave device according to claim 1, wherein a region where the electrode fingers adjacent to each other overlap each other when viewed in a direction in which the electrode fingers adjacent to each other are opposed is an excitation region, and when a metallization ratio of the plurality of electrode fingers relative to the excitation region is defined as MR, MR≤about 1.75 (d/p)+0.075 is satisfied.

7. The piezoelectric bulk wave device according to claim 1, wherein the piezoelectric layer is a lithium tantalate layer or a lithium niobate layer.

8. The piezoelectric bulk wave device according to claim 7, wherein

Euler angles ($\phi$, $\theta$, $\psi$) of the lithium niobate layer or the lithium tantalate layer of the piezoelectric layer fall in a range defined by expression (1), expression (2), or expression (3):

$$(0°±10°, 0° \text{ to } 20°, \text{any } \psi) \quad \text{expression (1);}$$

$$(0°±10°, 20° \text{ to } 80°, 0° \text{ to } 60°(1-(\theta-50)^2/900)^{1/2}) \text{ or } (0°±10°, 20° \text{ to } 80°, [180°-60°(1-(\theta-50)^2/900)^{1/2}] \text{ to } 180°) \quad \text{expression (2);}$$

$$(0°±10°, [180°-30°(1-(\psi-90)^2/8100)^{1/2}] \text{ to } 180°, \text{any } \psi) \quad \text{expression; and (3).}$$

9. The piezoelectric bulk wave device according to claim 1, wherein the support substrate includes silicon or aluminum oxide.

10. The piezoelectric bulk wave device according to claim 2, wherein the insulating layer includes silicon oxide or tantalum pentoxide.

11. The piezoelectric bulk wave device according to claim 2, wherein the hollow portion is defined by a recess in the insulating layer and the piezoelectric layer covering the recess.

12. The piezoelectric bulk wave device according to claim 1, wherein the frequency adjustment film includes silicon oxide or silicon nitride.

13. A method of manufacturing a piezoelectric bulk wave device, the method comprising:

providing an IDT electrode on a third principal surface of a piezoelectric substrate including the third principal surface and a fourth principal surface opposed to each other, the IDT electrode including a pair of comb-shaped electrodes each including at least one electrode finger of a plurality of electrode fingers and a busbar connected to one end of the at least one electrode finger;

providing a sacrificial layer to at least one of the third principal surface of the piezoelectric substrate and a support substrate;

forming a multilayer body by joining the support substrate to a third principal surface side of the piezoelectric substrate, the multilayer body including the support substrate and the piezoelectric substrate in which the sacrificial layer covers at least the plurality of electrode fingers of the IDT electrode;

forming a piezoelectric layer including a first principal surface corresponding to the third principal surface and a second principal surface opposed to the first principal surface by grinding a fourth principal surface side of the piezoelectric substrate so as to reduce a thickness of the piezoelectric substrate;

providing a frequency adjustment film on the second principal surface of the piezoelectric layer;

providing a plurality of via holes to the piezoelectric layer and the frequency adjustment film;

providing a plurality of wiring electrodes in the respective via holes and on the frequency adjustment film so as to be electrically connected to the respective busbars;

providing a through hole in the piezoelectric layer and the frequency adjustment film so as to extend to the sacrificial layer;

forming a hollow portion in a piezoelectric board including the support substrate and the piezoelectric layer by removing the sacrificial layer by using the through hole; and adjusting a frequency by grinding the frequency adjustment film.

14. The method of manufacturing a piezoelectric bulk wave device according to claim 13, wherein the third principal surface of the piezoelectric substrate is provided with the sacrificial layer so as to cover at least the pluralities of electrode fingers of the IDT electrode in the providing a sacrificial layer;

the method further includes:

providing a first insulating layer on the third principal surface of the piezoelectric substrate so as to cover the sacrificial layer and the IDT electrode; and providing a second insulating layer on one of principal surfaces of the support substrate; and an insulating layer is formed by joining the first insulating layer to the second insulating layer in the forming a multilayer body.

15. The method of manufacturing a piezoelectric bulk wave device according to claim 13, further comprising:

providing a plurality of connection electrodes on the third principal surface of the piezoelectric substrate so as to be connected the respective busbars; wherein the via holes extend to the respective connection electrodes in the providing a plurality of via holes; and the plurality of wiring electrodes are provided in the respective via holes and on the frequency adjustment film so as to be connected to the respective connection electrodes in the providing a plurality of wiring electrodes.

16. The method of manufacturing a piezoelectric bulk wave device according to claim 14, wherein the via holes extend to the respective busbars in the providing a plurality of via holes; and the plurality of wiring electrodes are provided in the respective via holes and on the frequency adjustment film so as to be connected to the respective busbars in the providing a plurality of wiring electrodes.

17. The method of manufacturing a piezoelectric bulk wave device according to claim 13, wherein the sacrificial layer includes at least one of ZnO, MgO, $SiO_2$, Cu, or resin.

18. The method of manufacturing a piezoelectric bulk wave device according to claim 13, wherein the support substrate includes silicon or aluminum oxide.

19. The method of manufacturing a piezoelectric bulk wave device according to claim 14, wherein the insulating layer includes silicon oxide or tantalum pentoxide.

20. The method of manufacturing a piezoelectric bulk wave device according to claim 13, wherein the frequency adjustment film includes silicon oxide or silicon nitride.

* * * * *